(12) United States Patent
Jeon et al.

(10) Patent No.: US 11,171,192 B2
(45) Date of Patent: Nov. 9, 2021

(54) DISPLAY DEVICE AND METHOD OF MANUFACTURING THE SAME

(71) Applicant: Samsung Display Co., Ltd., Yongin-Si (KR)

(72) Inventors: Yong-Je Jeon, Yongin-si (KR); Min Woo Woo, Seoul (KR); Wangwoo Lee, Osan-si (KR)

(73) Assignee: Samsung Display Co., Ltd.

( * ) Notice: Subject to any disclaimer, the term of this patent is extended or adjusted under 35 U.S.C. 154(b) by 55 days.

(21) Appl. No.: 16/741,623

(22) Filed: Jan. 13, 2020

(65) Prior Publication Data

US 2020/0303480 A1 Sep. 24, 2020

(30) Foreign Application Priority Data

Mar. 22, 2019 (KR) .................... 10-2019-0032957

(51) Int. Cl.
| | |
|---|---|
| *H01L 27/32* | (2006.01) |
| *H01L 51/00* | (2006.01) |
| *H01L 51/56* | (2006.01) |
| *H01L 49/02* | (2006.01) |
| *H01L 27/12* | (2006.01) |

(52) U.S. Cl.
CPC ...... *H01L 27/3262* (2013.01); *H01L 27/3265* (2013.01); *H01L 51/0096* (2013.01); *H01L 51/56* (2013.01); *H01L 27/1255* (2013.01); *H01L 27/1259* (2013.01); *H01L 28/60* (2013.01); *H01L 2227/323* (2013.01)

(58) Field of Classification Search
CPC ............ H01L 27/3262; H01L 27/3265; H01L 51/0096; H01L 51/56; H01L 27/1255; H01L 27/1259; H01L 28/60; H01L 2227/323
USPC .......................................................... 257/40
See application file for complete search history.

(56) References Cited

U.S. PATENT DOCUMENTS

| | | | | |
|---|---|---|---|---|
| 6,046,547 | A * | 4/2000 | Nishio ................. | G09G 3/30 313/500 |
| 2007/0132374 | A1* | 6/2007 | Park ..................... | H01L 27/3253 313/504 |
| 2011/0241562 | A1* | 10/2011 | Choi .................... | H01L 27/3279 315/291 |
| 2016/0011633 | A1* | 1/2016 | Watanabe ............. | G09G 3/3648 345/184 |
| 2016/0293888 | A1* | 10/2016 | Shim .................... | H01L 51/5228 |
| 2017/0154935 | A1* | 6/2017 | Cai ...................... | H01L 51/5209 |
| 2018/0101276 | A1* | 4/2018 | Hanari ................. | G06F 1/1684 |
| 2018/0124898 | A1 | 5/2018 | Kwon et al. | |
| 2019/0131378 | A1* | 5/2019 | Sung .................... | H01L 51/5221 |

* cited by examiner

*Primary Examiner* — Dzung Tran
(74) *Attorney, Agent, or Firm* — Innovation Counsel LLP

(57) ABSTRACT

A display device may include a substrate, an organic light emitting layer overlapping the substrate and including an opening, and a holed insulating layer positioned between the substrate and the organic light emitting layer. The holed insulating layer may include a first through hole, a first groove, and a first undercut. A position of the opening may overlap a position of the first groove. The first groove may surround the first through hole in a plan view of the display device. The first undercut may surround the first groove in the plan view of the display device.

11 Claims, 32 Drawing Sheets

DISPLAY DEVICE AND METHOD OF MANUFACTURING THE SAME

CROSS-REFERENCE TO RELATED APPLICATION

This application claims priority under 35 USC § 119 to Korean Patent Application No. 10-2019-0032957 filed on Mar. 22, 2019 in the Korean Intellectual Property Office (KIPO); the entire disclosure of the Korean Patent Application is incorporated herein by reference.

BACKGROUND

1. Field

The technical field relates to a display device and a method for manufacturing the display device.

2. Description of the Related Art

A display device (such as a liquid crystal display device or an organic light emitting diode display device) may include various electrical/electronic elements and/or optical elements. The electrical/electronic elements and/or optical elements may control light transmission and/or light emission, such that the display device may display images.

If contaminants (such as moisture and/or oxygen) are introduced into the display device, durability and/or performance of some of the electrical/electronic elements and/or optical elements may deteriorate. For example, the luminous efficiency of an organic light emitting layer may be reduced in an organic light emitting diode display device. As a result, image display quality of the display device may be undesirable.

SUMMARY

Some example embodiments may be related to a display device that can prevent the inflow of potential contaminants such as moisture and/or oxygen.

Some example embodiments may be related to a method of manufacturing the display device.

According to example embodiments, a display device may include a substrate including a display area and a non-display area located within the display area, a plurality of insulating layers disposed on the substrate, an organic light emitting layer disposed on the insulating layers, and an undercut-groove disposed in the non-display area and including a groove formed by removing at least one of the insulating layers and an undercut formed in a sidewall of the groove.

In example embodiments, the display device may further include a buffer layer formed on the substrate, a first insulating layer formed on the buffer layer, a second insulating layer formed on the first insulating layer to cover a gate electrode which is formed on the first insulating layer, a third insulating layer formed on the second insulating layer to cover a capacitor electrode which is formed on the second insulating layer, and a fourth insulating layer formed on the third insulating layer to cover source and drain electrodes which are formed on the third insulating layer.

In example embodiments, the undercut-groove may include a groove formed by removing the buffer layer, the first insulating layer, the second insulating layer, and the third insulating layer, a first undercut formed in a first sidewall of the groove, and a second undercut formed in a second sidewall of the groove facing the first sidewall.

In example embodiments, the first undercut may be formed between the first insulating layer and the second insulating layer in the first sidewall. In addition, the second undercut may be formed between the first insulating layer and the second insulating layer in the second sidewall.

In example embodiments, the first undercut may be formed between the second insulating layer and the third insulating layer in the first sidewall of the groove. In addition, the second undercut may be formed between the second insulating layer and the third insulating layer in the second sidewall of the groove.

In example embodiments, the undercut-groove may include a groove formed by removing the second insulating layer and the third insulating layer, a first undercut formed between a bottom surface and a first sidewall of the groove, and a second undercut formed between the bottom surface of the groove and a second sidewall facing the first sidewall.

In example embodiments, the first undercut may be formed between the first insulating layer on the bottom surface and the second insulating layer on the first sidewall. In addition, the second undercut may be formed between the first insulating layer on the bottom surface and the second insulating layer on the second sidewall.

In example embodiments, the undercut-groove may further include a third undercut formed between the second insulating layer and the third insulating layer in the first sidewall and a fourth undercut formed between the second insulating layer and the third insulating layer in the second sidewall.

In example embodiments, the undercut-groove may include a groove formed by removing the third insulating layer, a first undercut formed under the second insulating layer adjacent to a first sidewall of the groove, and a second undercut formed under the second insulating layer adjacent to a second sidewall of the groove facing the first sidewall.

In example embodiments, the undercut-groove may include a groove formed by removing the buffer layer, the first insulating layer, the second insulating layer, the third insulating layer, and the fourth insulating layer, a first undercut formed between the third insulating layer and the fourth insulating layer in a first sidewall of the groove, and a second undercut formed between the third insulating layer and the fourth insulating layer in a second sidewall of the groove facing the first sidewall.

In example embodiments, the display device may further include a fifth insulating layer formed between the third insulating layer and the fourth insulating layer. In addition, the undercut-groove may include a groove formed by removing the buffer layer, the first insulating layer, the second insulating layer, the third insulating layer, the fourth insulating layer, and the fifth insulating layer, a first undercut formed between the first insulating layer and the fourth insulating layer in a first sidewall of the groove, and a second undercut formed between the first insulating layer and the fourth insulating layer in a second sidewall of the groove facing the first sidewall.

According to example embodiments, a method of manufacturing a display device may include forming a plurality of insulating layers on a substrate including a display area and a non-display area located within the display area, forming an undercut-groove including a groove formed by removing at least one of the insulating layers formed in the non-display area and an undercut formed in a sidewall of the groove, and forming an organic light emitting layer on the substrate in which the undercut-groove is formed.

In example embodiments, the forming the insulating layers may include forming a buffer layer on the substrate, forming a first insulating layer on the buffer layer, forming a second insulating layer on the first insulating layer to cover a gate electrode which is formed of a first conductive layer on the first insulating layer, forming a third insulating layer on the second insulating layer to cover a capacitor electrode which is formed of a second conductive layer on the second insulating layer, and forming a fourth insulating layer on the third insulating layer to cover source and drain electrodes which are formed of a third conductive layer on the third insulating layer.

In example embodiments, the forming the undercut-groove may include forming a first undercut electrode and a second undercut electrode spaced apart from the first undercut electrode in the non-display area by using the first conductive layer, forming the groove by removing the buffer layer, the first insulating layer, the second insulating layer, and the third insulating layer to expose the first undercut electrode and the second undercut electrode, and removing the first and second undercut electrodes to form a first undercut in which the first undercut electrode is removed in a first sidewall of the groove and to form a second undercut in which the second undercut electrode is removed in a second sidewall of the groove.

In example embodiments, the forming the undercut-groove may include forming a first undercut electrode and a second undercut electrode spaced apart from the first undercut electrode in the non-display area by using the second conductive layer, forming the groove by removing the buffer layer, the first insulating layer, the second insulating layer, and the third insulating layer to expose the first undercut electrode and the second undercut electrode, and removing the first and second undercut electrodes to form a first undercut in which the first undercut electrode is removed in a first sidewall of the groove and to form a second undercut in which the second undercut electrode is removed in a second sidewall of the groove.

In example embodiments, the forming the undercut-groove may include forming an undercut electrode in the non-display area by using the first conductive layer, forming the groove by removing the second insulating layer and the third insulating layer to expose a portion of a top surface of the undercut electrode, and removing the undercut electrode to form a first undercut in which a first end of the undercut electrode is removed in a first sidewall of the groove and to form a second undercut in which a second end of the undercut electrode is removed in a second sidewall of the groove.

In example embodiments, the method may further include removing the buffer layer and the first insulating layer exposed by the groove.

In example embodiments, the forming the undercut-groove may include forming a first undercut electrode in the non-display area by using the first conductive layer, forming a second undercut electrode overlapping a first end of the first undercut electrode and a third undercut electrode overlapping a second end of the first undercut electrode, by using the second conductive layer, forming the groove by removing the second insulating layer and the third insulating layer to expose the first undercut electrode, the second undercut electrode, and the third undercut electrode, and removing the first undercut electrode, the second undercut electrode, and the third undercut electrode to form a first undercut in which the first end of the first undercut electrode is removed between a bottom surface and a first sidewall of the groove, to form a second undercut in which the second end of the first undercut electrode is removed between the bottom surface and a second sidewall of the groove, to form a third undercut in which the first undercut electrode is removed in the first sidewall, and to form a fourth undercut in which the second undercut electrode is removed in the second sidewall.

In example embodiments, the forming the undercut-groove may include forming a first undercut electrode and a second undercut electrode spaced apart from the first undercut electrode in the non-display area by using the first conductive layer, forming a third undercut electrode including a first end overlapping the first undercut electrode and a second end overlapping the second undercut electrode, by using the second conductive layer, forming the groove by removing the second insulating layer and the third insulating layer to expose the first undercut electrode, the second undercut electrode, and the third undercut electrode, and removing the first undercut electrode, the second undercut electrode, and the third undercut electrode to form a first undercut in which the first undercut electrode is removed under the second insulating layer adjacent to a first sidewall of the groove and to form a second undercut in which the second undercut electrode is removed under the second insulating layer adjacent to a second sidewall of the groove.

In example embodiments, the forming the undercut-groove may include forming a groove pattern in the non-display area by removing the buffer layer, the first insulating layer, the second insulating layer, and the third insulating layer, forming an undercut electrode including a bottom formed on a bottom surface of the groove pattern, a first side formed on a first sidewall of the groove pattern, a second side formed on a second sidewall of the groove pattern, a first end formed on a top of the third insulating layer connected to the first sidewall, and a second end formed on the top of the third insulating layer connected to the second sidewall, by using the third conductive layer, forming the groove by removing the fourth insulating layer to expose the first side, the second side, and the bottom of the undercut electrode, and removing the undercut electrode to form a first undercut in which the first end of the undercut electrode is removed in a first sidewall of the groove and to form a second undercut in which the second end of the undercut electrode is removed in a second sidewall of the groove.

In example embodiments, the forming the undercut-groove may include forming a first undercut electrode and a second undercut electrode spaced apart from the first undercut electrode in the non-display area by using the first conductive layer, forming a groove pattern by removing the buffer layer, the first insulating layer, the second insulating layer, and the third insulating layer to expose the first and second undercut electrodes, forming a third undercut electrode including a first end making contact with the first undercut electrode, a first side making contact with a first sidewall of the groove pattern, a bottom making contact with the substrate, a second side making contact with a second sidewall of the groove pattern, and a second end making contact with the second undercut electrode, by using a fourth conductive layer, forming the groove configured to expose the bottom, the first side, and the second side of the third undercut electrode by removing at least one of the insulating layers formed on the third undercut electrode, and removing the third undercut electrode and the first and second undercut electrodes making contact with the third undercut electrode to form a first undercut in which the first undercut electrode and the first end of the third undercut electrode are removed in a first sidewall of the groove and to form a second undercut in which the second undercut electrode and the second end of the third undercut electrode are removed in a second sidewall of the groove.

An embodiment may be related to a display device. The display device may include a substrate, an organic light emitting layer overlapping the substrate and including an opening, and a holed insulating layer positioned between the substrate and the organic light emitting layer. The holed insulating layer may include a first through hole, a first groove, and a first undercut. The first groove may surround the first through hole in a plan view of the display device. A position of the opening may overlap a position of the first groove. The first undercut may surround the first groove in the plan view of the display device. For example, the holed insulating layer may be illustrated by the layer 160 in FIG. 3, the layer 180 in FIG. 8, the layer 160 in FIG. 12, the layer 180 in FIG. 17, the layer 160 in FIG. 21, the layer 210 in FIG. 25, and/or the layer 160 in FIG. 29.

The display device may include the following elements: a buffer layer formed on the substrate; an intervening insulating layer positioned between the buffer layer and the holed insulating layer; and a gate electrode positioned between the intervening insulating layer and the holed insulating layer. The features may be illustrated in, for example, FIG. 3 and/or FIG. 8.

The holed insulating layer may include a second undercut, wherein the second undercut may surround the first through hole in the plan view of the display device, and wherein the first groove may surround the second undercut in the plan view of the display device. The features may be illustrated in, for example, FIG. 1, FIG. 2, FIG. 3, FIG. 8, FIG. 12, FIG. 17, FIG. 21, FIG. 25, and/or FIG. 29.

The display device may include the following elements: a transistor including a gate electrode; and an intervening insulating layer positioned between the substrate and the holed insulating layer, wherein the gate electrode may be positioned between the intervening insulating layer and the holed insulating layer, and wherein a wall of the first undercut directly contacts the intervening insulating layer. The features may be illustrated in, for example, FIG. 3.

The display device may include the following elements: a transistor including a source electrode; and an intervening insulating layer positioned between the substrate and the holed insulating layer, wherein the source electrode may be positioned between the holed insulating layer and the organic light emitting layer, and wherein a wall of the first undercut directly contacts the intervening insulating layer. The features may be illustrated in, for example, FIG. 8.

The display device may include the following elements: an overlapping insulating layer overlapping the holed insulating layer, positioned between the holed insulating layer and the organic light emitting layer, and including a second groove, wherein the second groove may be directly connected to the first groove. The features may be illustrated in, for example, FIG. 12.

The display device may include the following element: a transistor including a source electrode, wherein the source electrode may be positioned between the overlapping insulating layer and the organic light emitting layer. The features may be illustrated in, for example, FIG. 12.

The display device may include the following element: an overlapping insulating layer overlapping the holed insulating layer and positioned between the holed insulating layer and the organic light emitting layer, wherein the holed insulating layer may include a second undercut. The second undercut may surround the first through hole in the plan view of the display device. The first groove may surround the second undercut in the plan view of the display device.

The overlapping insulating layer may include a second groove, a third undercut, and a fourth under cut. A position of the second groove may overlap a position of the first groove. The fourth undercut may be closer to the first through hole than the second groove. The second groove may be closer to the first through hole than the third undercut. The features may be illustrated in, for example, FIG. 1, FIG. 2, and FIG. 17.

The display device may include the following element: a transistor including a source electrode, wherein the source electrode may be positioned between the overlapping insulating layer and the organic light emitting layer. The features may be illustrated in, for example, FIG. 17.

The display device may include the following elements: a transistor may include a source electrode; and a storage capacitor may include a first capacitor electrode, wherein the holed insulating layer may be positioned between the organic light emitting layer and at least one of the source electrode and the first capacitor electrode. The features may be illustrated in, for example, FIG. 25.

The display device may include the following element: an overlapping insulating layer positioned between the holed insulating layer and the organic light emitting layer, overlapping the holed insulating layer, partially positioned inside the first groove, and including an additional undercut, wherein the additional undercut may be at least partially positioned inside the first groove. The features may be illustrated in, for example, FIG. 29.

An embodiment may be related to a method for manufacturing a display device. The method may include the following steps: forming a holed insulating layer, wherein the holed insulating layer may overlap a substrate and comprises a first through hole, a first groove, and a first undercut, wherein the first groove may surround the first through hole in a plan view of the display device, and wherein the first undercut may surround the first groove in the plan view of the display device; and forming an organic light emitting layer. The holed insulating layer may be positioned between the substrate and the organic light emitting layer and may include an opening. A position of the opening may overlap a position of the first groove. For example, the holed insulating layer may be illustrated by the layer 160 in FIG. 3, the layer 180 in FIG. 8, the layer 160 in FIG. 12, the layer 180 in FIG. 17, the layer 160 in FIG. 21, the layer 210 in FIG. 25, and/or the layer 160 in FIG. 29.

The method may include the following steps: forming a storage capacitor, wherein the storage capacitor may include a first capacitor electrode and a second capacitor electrode, and wherein the first capacitor electrode may be positioned between the substrate and the second capacitor electrode; forming a transistor, wherein the transistor may include a gate electrode; forming a first conductive member, wherein a material of the first conductive member may be identical to at least one of a material of the first capacitor electrode and a material of the gate electrode; using the first conductive member to form (and shape) the first undercut; and removing the first conductive member. The features may be illustrated in, for example, FIGS. 3 to 7.

The method may include the following steps: forming a buffer layer, wherein the buffer layer may be positioned between the substrate and the holed insulating layer and may include a buffer layer groove, wherein a position of the buffer layer groove may overlap a positon of the first groove; forming an organic member inside the buffer layer groove, wherein a material of the organic member may be identical to a material of the organic light emitting layer. The features may be illustrated in, for example, FIG. 3 and/or FIG. 8.

The method may include the following steps: forming a storage capacitor, wherein the storage capacitor may include a first capacitor electrode a second capacitor electrode, and wherein the first capacitor electrode may be positioned between the substrate and the second capacitor electrode; forming a first conductive member, wherein a material of the first conductive member may be identical to a material of the second capacitor electrode; using the first conductive member to form the first undercut; and removing the first conductive member. The features may be illustrated in, for example, FIGS. 8 to 11.

The method may include the following steps: forming a storage capacitor, wherein the storage capacitor may include a first capacitor electrode and a second capacitor electrode, and wherein the first capacitor electrode may be positioned between the substrate and the second capacitor electrode; forming a transistor, wherein the transistor may include a gate electrode; forming a first conductive member, wherein a material of the first conductive member may be identical to at least one of a material of the first capacitor electrode and a material of the gate electrode; using the first conductive member to form both the first undercut and a second undercut, wherein the holed insulating layer may include the second undercut, and wherein the first undercut may be closer to the first capacitor electrode than the second undercut; and removing the first conductive member. The features may be illustrated in, for example, FIGS. 12 to 16 and/or FIGS. 17 to 20.

The method may include the following step: forming an organic member inside the first groove, wherein a material of the organic member may be identical to a material of the organic light emitting layer. The features may be illustrated in, for example, FIG. 12 and/or FIG. 17.

The method may include the following steps: forming an overlapping insulating layer, wherein the overlapping insulating layer may overlap the holed insulating layer, may be positioned between the holed insulating layer and the organic light emitting layer, and may include an a third undercut; forming a second conductive member, wherein a material of the second conductive member may be identical to a material of the second capacitor electrode; using the second conductive member to form the third undercut; and removing the second conductive member. The features may be illustrated in, for example, FIGS. 17 to 20.

The method may include the following steps: forming a contained insulating member inside the first groove, wherein a material of the contained insulating member may be identical to a material of the holed insulating layer, wherein the contained insulating member may include a contained undercut, and wherein the contained undercut may be opposite the first undercut; forming a storage capacitor, wherein the storage capacitor may include a first capacitor electrode and a second capacitor electrode, wherein the second capacitor electrode may be spaced from the first capacitor electrode; forming a transistor, wherein the transistor may include a gate electrode; forming a first conductive member, wherein a material of the first conductive member may be identical to at least one of a material of the capacitor electrode and a material of the gate electrode; using the first conductive member to form both the first undercut and the contained undercut; removing the first conductive member; forming a second conductive member, wherein a material of the second conductive member may be identical to a material of the second capacitor electrode, wherein a first portion of the second conductive member may be positioned inside a recess of the contained insulating member, wherein a second portion of the second conductive member may be positioned outside the recess of the contained insulating member and may overlap the first conductive member; and removing the second portion of the second conductive member, wherein a face of the first portion of the second conductive member may be coplanar with a face of the contained insulating member. The features may be illustrated in, for example, FIGS. 21 to 24.

The method may include the following steps: forming a transistor, wherein the transistor may include a source electrode; forming a first conductive member, wherein a material of the first conductive member may be identical to a material of the source electrode; using the first conductive member to form the first undercut; and removing the first conductive member. The features may be illustrated in, for example, FIGS. 25 to 28.

The method may include the following steps: forming a storage capacitor, wherein the storage capacitor may include a first capacitor electrode and a second capacitor electrode; forming a transistor, wherein the transistor may include a source electrode and a gate electrode; forming a connection electrode, wherein the source electrode may be electrically connected through the connection electrode to the second capacitor electrode; forming an overlapping insulating layer, wherein the overlapping insulating may overlap the holed insulating layer, may be positioned between the holed insulating layer and the organic light emitting layer, and may include an additional undercut and an additional groove, wherein a position of the additional groove may overlap a position of the first groove; forming a first conductive member, wherein a material of the first conductive member may be identical to at least one of the material of the first capacitor electrode and a material of the gate electrode; forming a second conductive member, wherein a material of the second conductive member may be identical to a material of the connection electrode, and wherein the second conductive member partially may overlap the first conductive member; using the first conductive member to form the first undercut; removing the first conductive member; using the second conductive member to form the additional undercut; and removing the second conductive member. The features may be illustrated in, for example, FIGS. 29 to 32.

According to embodiments, one or more undercuts of an insulating layer may effectively separate organic material portions (e.g., portions of an organic light emitting material layer). Advantageously, a display device according to example embodiments may prevent moisture and potential contaminants (e.g., in external air) from being transmitted into a display area through an organic material layer.

DETAILED DESCRIPTION OF EMBODIMENTS

Although the terms "first," "second," etc. may be used to describe various elements, these elements, should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The term "remove" may mean "partially remove" or "completely remove," depending on context. The term "groove" may mean "opening." The term "undercut" may mean "(empty) recess having a wall and a ceiling." The term "electrode" may mean "conductive member." The term "undercut electrode" may mean "conductive member used for forming an undercut." The term "removing an undercut electrode" may mean "using and removing a conductive member." The term "form an undercut" may mean "form and shape an undercut." The term "external element" may mean "functional element" for performing functions different from displaying images. The term "connect" may mean "electrically connect." The term "insulate" may mean "electrically insulate." The term "contact" may mean "directly contact." The term "located with" may mean "surrounded by." The term "pattern" may mean "member." The term "the bottom surface of a groove" may mean "a surface of an insulating layer underlying the groove." A list/plurality of items may mean at least one of the items.

Figure 1:
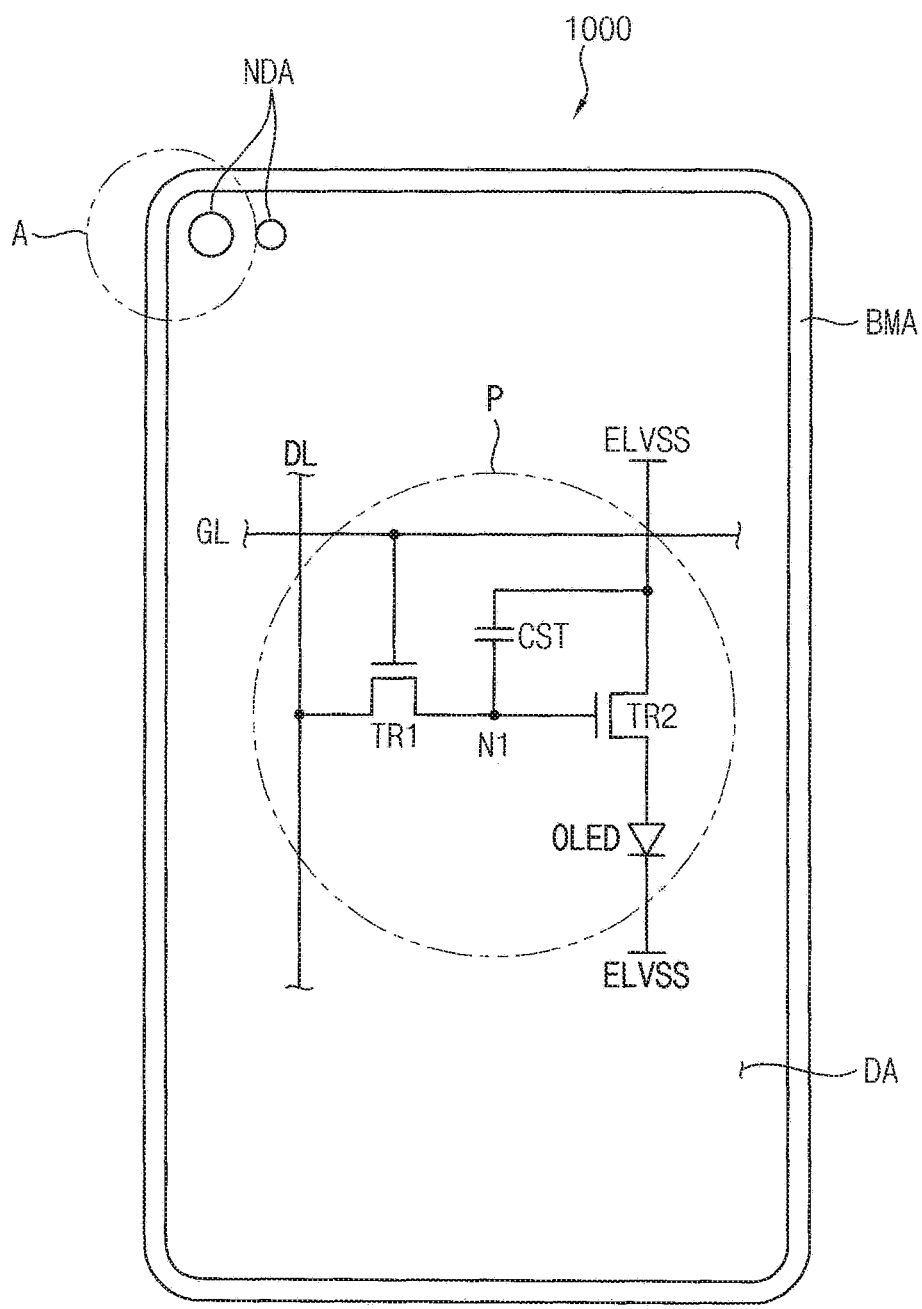
FIG. 1 is a schematic plan view illustrating a display device according to example embodiments.
Figure 2:
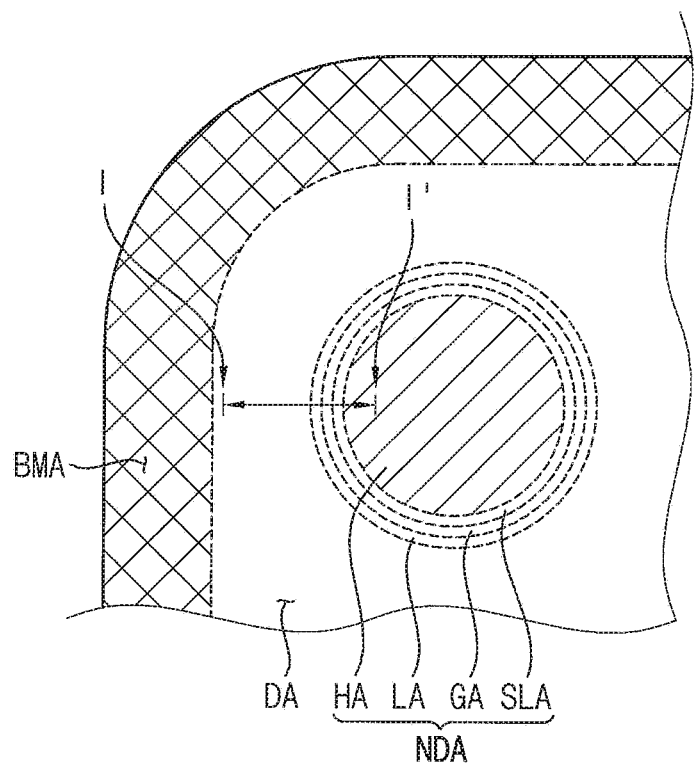
FIG. 2 is an enlarged diagram of a portion A shown in FIG. 1 according to example embodiments.

FIG. 1 is a schematic plan view illustrating a display device according to example embodiments, and FIG. 2 is an enlarged diagram of a portion A shown in FIG. 1 according to example embodiments.

Referring to FIGS. 1 and 2, a display device 1000 includes a first substrate 100 and a second substrate 400 facing the first substrate 100.

The first substrate 100 and the second substrate 400 may include an insulating substrate including at least one of glass, quartz, plastic, etc. In one embodiment, the first substrate 100 and the second substrate 400 may include an insulating substrate formed of rigid materials such as glass or quartz.

The display device 1000 includes a display area DA, a light blocking area BMA, and a non-display area NDA.

The display area DA is an area configured to display an image, and pixels P may be arranged in the display area DA.

The pixel P may be connected to a gate line GL, a data line DL, a first power supply signal ELVDD, and a second power supply signal ELVSS and may include a plurality of transistors and a storage capacitor.

For example, the pixel P includes a first transistor TR1, a second transistor TR2, a storage capacitor CST, and an organic light emitting diode OLED.

The first transistor TR1 includes a gate electrode connected to the gate line GL, a source electrode connected to the data line DL, and a drain electrode connected to the first node N1. The second transistor TR2 includes a gate electrode connected to the first node N1, a source electrode connected to the first power supply signal ELVDD, and a drain electrode connected to the organic light emitting diode OLED. The storage capacitor CST includes a first capacitor electrode connected to the first node N1 and a second capacitor electrode connected to the first power supply signal ELVDD. The organic light emitting diode OLED includes an anode connected to the second transistor TR2 and a cathode connected to the second power ELVSS.

When the first transistor TR1 is turned on by a gate signal transmitted from the gate line GL, the first transistor TR1 transmits the data signal transmitted from the data line DL to the first node N1. The second transistor TR2 provides a driving current to the organic light emitting diode OLED based on a voltage between the first power supply signal ELVDD stored in the storage capacitor CST and the data signal applied to the first node N1. The organic light emitting diode OLED emits light based on the driving current.

The light blocking area BMA is an area configured to surround an edge of the display area DA, and is an area in which light is blocked out. Various driving circuits for driving the pixel P may be disposed in the light blocking are BMA.

The non-display area NDA is an area located within the display area DA, and the pixels P are not arranged in the non-display area NDA. The non-display area NDA may include an area in which a hole is formed by cutting the display device 1000 to dispose external elements (such as cameras and sensors) having various functions.

Referring to FIG. 2, the non-display area NDA may have, for example, at least one of various shapes such as a circular shape, a rectangular shape, or a polygonal shape.

The non-display area NDA may include a hole area HA, a seal area SLA, a groove area GA, and a signal line area LA.

The hole area HA may include the hole (or referred to as a first through hole in claims), and the external element may be inserted into the hole.

The seal area SLA may include a sealant configured to seal the first substrate 100 and the second substrate 400 of the display device 1000.

The groove area GA is configured to block moisture and/or potential contaminants in air from being introduced into the display area DA.

An undercut-groove UG1, formed by partially removing a plurality of insulating layers on the first substrate 100, may be disposed in the groove area GA.

The undercut-groove UG1 may include a groove GR formed by removing the insulating layers, at least one first undercut UC1 formed in a first sidewall of the groove GR, and at least one second undercut UC2 formed in a second sidewall of the groove GR facing the first sidewall.

The groove GR may be formed along the shape of the non-display area NDA. For example, as shown in FIG. 2, the groove GR may have a circular shape corresponding to the non-display area NDA. In a plan view of the display device 1000, the first undercut UC1 may surround the groove GR, the groove GR may surround each of a sealant 300 and the second undercut UC2, and each of the sealant 300 and the second undercut UC2 may surround the hole and the hole area HA.

A plurality of signal lines connected to the external element disposed in the non-display area NDA to transmit a driving signal may be arranged in the signal line area LA. The signal lines may have sections formed along the shape of the non-display area NDA. For example, each of the signal lines may include a section that has a circular shape corresponding to the non-display area NDA.

According to embodiments, the undercut-groove UG1 formed in the groove area GA may prevent potential contaminants in the air from being introduced into the display area DA through a section of the hole area HA.

Figure 3:
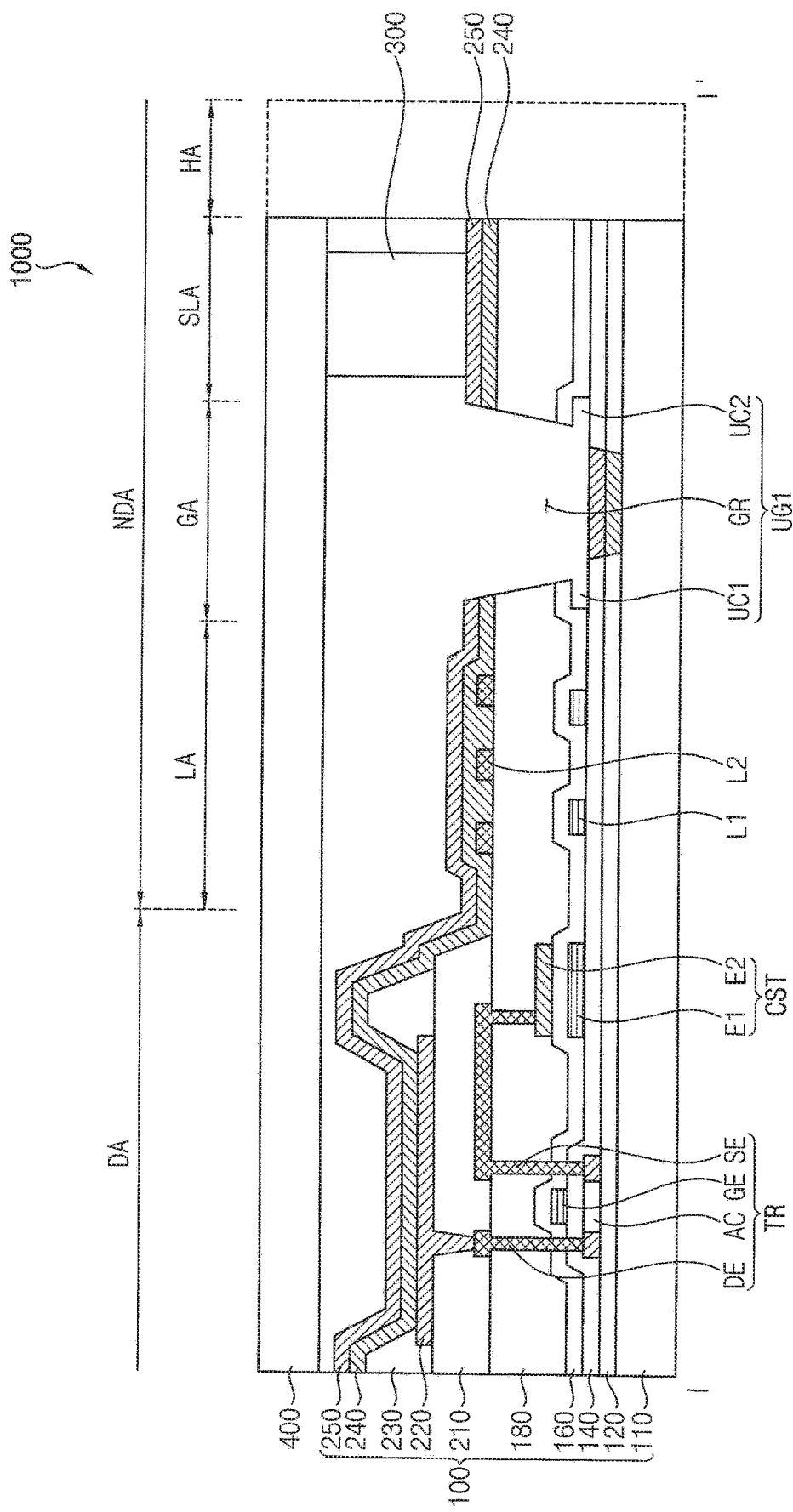
FIG. 3 is a cross-sectional diagram (or cross-sectional view) taken along a line I-I' shown in FIG. 2 for describing a display device according to example embodiments.

FIG. 3 is a cross-sectional diagram taken along a line I-I' shown in FIG. 2 for describing a display device according to example embodiments.

Referring to FIGS. 2 and 3, the display device 1000 includes the first substrate 100 and the second substrate 400, and includes the display area DA (in which the pixels P are arranged) and the non-display area NDA (located within the display area DA). The non-display area NDA includes the signal line area LA, the groove area GA, the seal area SLA, and the hole area HA.

The first substrate 100 includes a base substrate 110. The base substrate 110 may be an insulating substrate including glass, quartz, plastic, etc. In one embodiment, the base substrate 110 may be a rigid insulating substrate formed of glass or quartz.

A buffer layer 120 may be disposed on the base substrate 110.

The buffer layer 120 may block the potential contaminants such as oxygen or moisture penetrating through the base substrate 110. In addition, the buffer layer 120 may provide a flat surface on a top of the base substrate 110. The buffer layer 120 may be an inorganic insulating layer including silicon nitride, silicon oxide, silicon oxynitride, etc. In embodiments, the buffer layer 120 may be optional.

A semiconductor layer AC may be disposed on the buffer layer 120. The semiconductor layer AC may be formed of amorphous silicon, polycrystalline silicon, an oxide semiconductor, etc.

The semiconductor layer AC may include a source region, a channel region, and a drain region.

A first insulating layer 140 may be disposed on the semiconductor layer AC.

The first insulating layer 140 may be disposed on the buffer layer 120 to cover the semiconductor layer AC. The first insulating layer 140 may be an inorganic insulating layer including silicon nitride, silicon oxide, silicon oxynitride, etc.

First conductive patterns GE, E1, and L1 may be disposed on the first insulating layer 140. The first conductive patterns GE, E1, and L1 may include a gate electrode GE of a transistor TR and a first capacitor electrode E1 of the storage capacitor CST disposed in the display area DA, and may include a first signal line L1 in the signal line area LA.

The second insulating layer 160 may be disposed on the first conductive patterns GE, E1, and L1. The second insulating layer 160 may be disposed on the first insulating layer 140 to cover the first conductive patterns GE, E1, and L1. The second insulating layer 160 may be an inorganic insulating layer including silicon nitride, silicon oxide, silicon oxynitride, etc.

A second conductive pattern E2 may be disposed on the second insulating layer 160.

The second conductive pattern E2 may include a second capacitor electrode E2 of the storage capacitor CST disposed in the display area DA.

A third insulating layer 180 may be disposed on the second conductive pattern E2. The third insulating layer 180 may be disposed on the second insulating layer 160 to cover the second conductive pattern E2. The third insulating layer 180 may be an inorganic insulating layer including silicon nitride, silicon oxide, silicon oxynitride, or the like, or an organic insulating layer including an acrylic resin, an epoxy-based resin, a polyimide-based resin, a polyester-based resin, or the like.

Third conductive patterns SE, DE, and L2 may be disposed on the third insulating layer 180.

The third conductive patterns SE, DE, and L2 may include a source electrode SE and a drain electrode DE of the transistor TR disposed in the display area DA, and may include a second signal line L2 disposed in the signal line area LA.

The source electrode SE and the drain electrode DE may be respectively connected to the source region and the drain region of the semiconductor layer AC through contact holes formed through the first insulating layer 140, the second insulating layer 160, and the third insulating layer 180.

A fourth insulating layer 210 may be disposed on the third conductive patterns SE, DE, and L2. The fourth insulating layer 210 may be disposed on the third insulating layer 180 to cover the third conductive patterns SE, DE, and L2. The fourth insulating layer 210 may provide a flat surface on tops of the third conductive patterns SE, DE, and L2. The fourth insulating layer 210 may be an organic insulating layer including an acrylic resin, an epoxy-based resin, a polyimide-based resin, a polyester-based resin, or the like, or an inorganic insulating layer including silicon nitride, silicon oxide, silicon oxynitride, or the like.

A pixel electrode 220 may be disposed on the fourth insulating layer 210. A pixel electrode 220 may be formed for each pixel. The pixel electrode 220 may be connected to the transistor TR through a contact hole formed in the fourth insulating layer 210. The pixel electrode 220 may include metal, transparent conductive oxide, etc.

A fifth insulating layer 230 may be disposed on the pixel electrode 220. The fifth insulating layer 230 may be disposed on the fourth insulating layer 210 to cover an edge of the pixel electrode 220. The fifth insulating layer 230 may include an opening configured to expose a portion of the pixel electrode 220. The opening may define a light emitting area of the pixel P. The fifth insulating layer 230 may include an organic insulating material such as an acrylic resin, an epoxy-based resin, a polyimide-based resin, or a polyester-based resin.

An organic light emitting layer 240 may be disposed substantially over an entire area of the base substrate 110 on which the pixel electrode 220 is disposed. The organic light emitting layer 240 may be provided with a hole injection layer (HIL) and/or a hole transport layer (HTL) having excellent hole transportability and configured to suppress movement of electrons which are not combined with holes in the light emitting layer 240 to increase an opportunity of recombination between the holes and the electrons.

A common electrode layer 250 may be disposed over an entire area of the base substrate 110 on which the organic light emitting layer 240 is disposed. The common electrode layer 250 may overlap the pixel electrode 220. The common electrode layer 250 may include metal, transparent conductive oxide, etc. An organic light emitting diode OLED may be defined in an area in which the pixel electrode 220, the organic light emitting layer 240, and the common electrode layer 250 overlap each other.

The undercut-groove UG1 is disposed in the groove area GA on the base substrate 110.

In one embodiment, the undercut-groove UG1 includes a groove GR formed by partially removing the buffer layer 120, the first insulating layer 140, the second insulating layer 160, and the third insulating layer 180. The undercut-groove UG1 includes a first undercut UC1 formed between the first insulating layer 140 and the second insulating layer 160 in the first sidewall of the groove GR, and a second undercut UC2 formed between the first insulating layer 140 and the second insulating layer 160 in the second sidewall of the groove GR.

A sealant 300 for coupling the second substrate 400 to the first substrate 100 is disposed in the seal area SLA on the base substrate 110.

According to embodiments, even when potential contaminants such as moisture and oxygen contained in the external air are introduced through a portion of the organic light emitting layer 240 exposed at the hole area HA, the potential contaminants are physically blocked/stopped by the undercut-groove UG1 formed in the groove area GA, so that the potential contaminants can be prevented from being introduced into the display area DA. The undercuts UC1 and UC2 may effectively separate organic material portions of the organic light emitting layer 240; therefore, the under-cut groove UG1 may effectively prevent the potential contaminants from reaching the display area DA through the organic light emitting layer 240.

FIGS. 4 to 7 are cross-sectional diagrams for describing a method of manufacturing the display device of FIG. 3.

Figure 4:
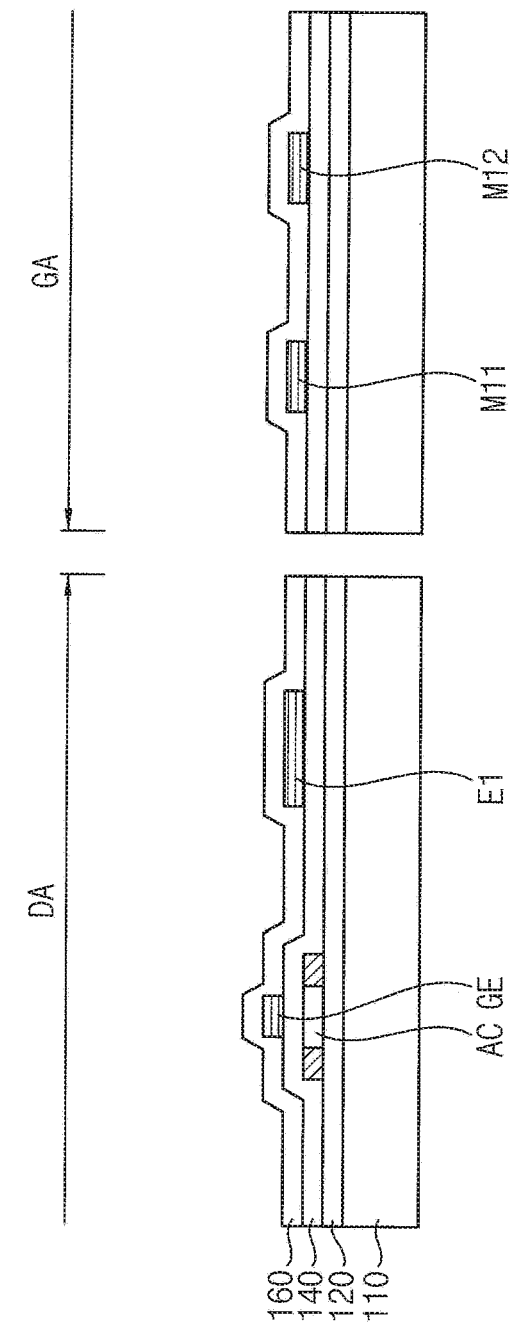
FIG. 4, FIG. 5, FIG. 6, and FIG. 7 are cross-sectional diagrams (or cross-sectional views) illustrating structures formed in a method of manufacturing the display device of FIG. 3 according to example embodiments.

Referring to FIG. 4, the buffer layer 120 may be formed on the base substrate 110. The semiconductor layer AC is formed on the buffer layer 120.

The first insulating layer 140 is formed on the base substrate 110 on which the semiconductor layer AC is formed.

A first conductive layer is formed on the first insulating layer 140, and first conductive patterns GE, E1, M11, and M12 are formed by patterning the first conductive layer. The first conductive patterns GE, E1, M11, and M12 include the gate electrode GE and the first capacitor electrode E1 of the storage capacitor CST formed in the display area DA, and include a first undercut electrode M11 and a second undercut electrode M12 formed in the groove area GA of the non-display area NDA.

The first undercut electrode M11 and the second undercut electrode M12 are spaced apart from each other, and a separation distance between the first undercut electrode M11 and the second undercut electrode M12 may correspond to a width of the groove GR which will be formed in the subsequent process.

The second insulating layer 160 is formed on the base substrate 110 on which the first conductive patterns GE, E1, M11, and M12 are formed.

Figure 5:
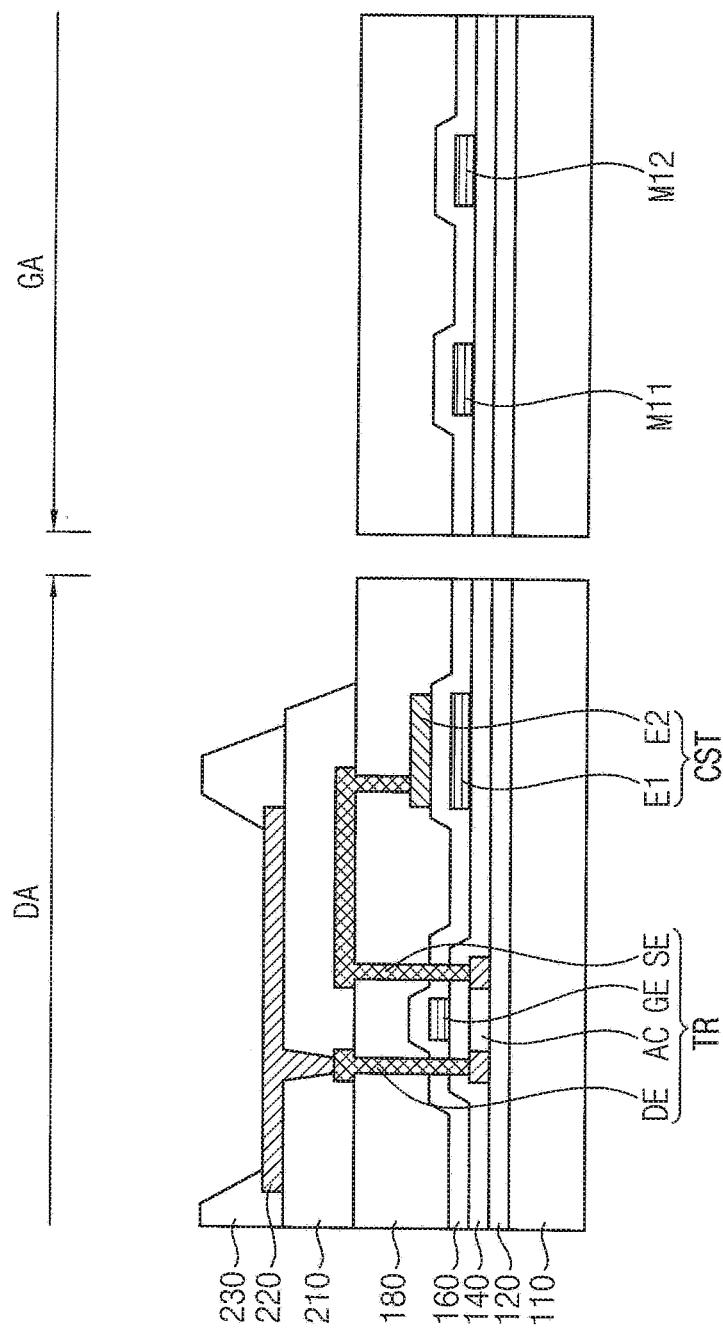

Referring to FIG. 5, a second conductive layer is formed on the base substrate 110 on which the second insulating layer 160 is formed, and the second conductive pattern E2 is formed by patterning the second conductive layer. The second conductive pattern E2 may include the second capacitor electrode E2 of the storage capacitor CST formed in the display area DA.

After the second conductive pattern E2 is formed, impurities are doped into the semiconductor layer AC by using the gate electrode GE as a mask. Accordingly, the semiconductor layer AC may be divided into the source region, the channel region, and the drain region.

The third insulating layer 180 is formed on the base substrate 110 on which the second conductive pattern E2 is formed. A plurality of contact holes are formed by simultaneously etching the first, second, and third insulating layers 140, 160, and 180.

A third conductive layer is formed on the base substrate 110 on which the contact holes are formed, and third conductive patterns SE and DE are formed by patterning the third conductive layer.

The third conductive patterns SE and DE may include the source electrode SE and the drain electrode DE of the transistor TR formed in the display area DA. The source electrode SE may be connected to the source region of the semiconductor layer AC through the contact hole, and the drain electrode DE may be connected to the drain region of the semiconductor layer AC through the contact hole. In addition, the transistor TR may be connected to the second capacitor electrode E2 of the storage capacitor CST through the contact hole.

The fourth insulating layer 210 is formed on the base substrate 110 on which the third conductive patterns SE and DE are formed. A contact hole configured to expose the drain electrode DE of the transistor TR is formed by patterning the fourth insulating layer 210.

The pixel electrode 220 is formed by depositing a conductive material such as metal or transparent conductive oxide on the fourth insulating layer 210 having the contact hole, and patterning the deposited conductive material.

The fifth insulating layer 230 is formed on the base substrate 110 on which the pixel electrode 220 is formed, and an opening configured to expose the pixel electrode 220 is formed by patterning the fifth insulating layer 230. The opening may define the light emitting area of the pixel P.

Figure 6:
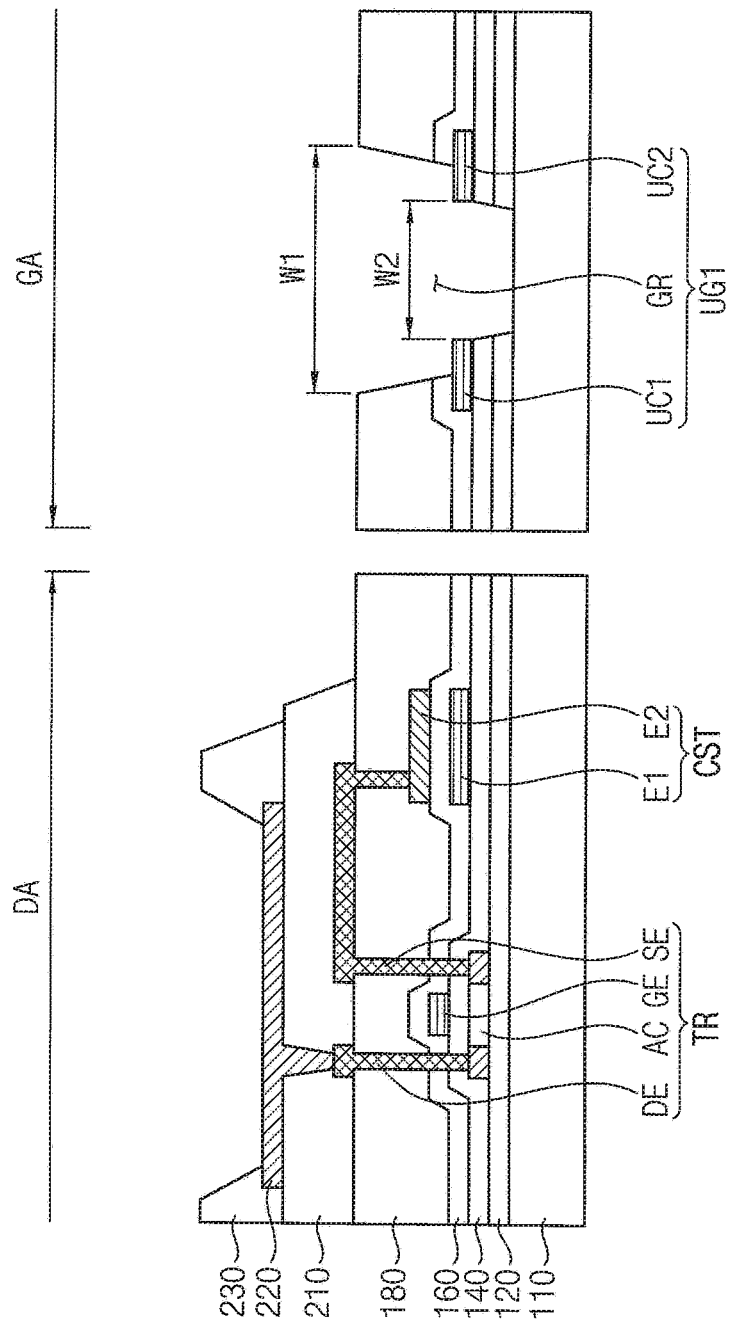

Referring to FIG. 6, after the fifth insulating layer 230 is formed in the display area DA, the groove GR is formed in the groove area GA through an etching process.

The groove GR is formed by removing the buffer layer 120, the first insulating layer 140, the second insulating layer 160, and the second insulating layer 140 between the first undercut electrode M11 and the second undercut electrode M12.

The groove GR is configured to expose an end of the first undercut electrode M11 and an end of the second undercut electrode M12.

The groove GR may include an upper region in which the second insulating layer 160 and the third insulating layer 180 are removed and a lower region in which the buffer layer 120 and the first insulating layer 140 are removed about the first undercut electrode M11 and the second undercut electrode M12. The upper region of the groove GR may have a first width W1, and the lower region of the groove GR may have a second width W2 that is smaller than the first width W1.

Figure 7:
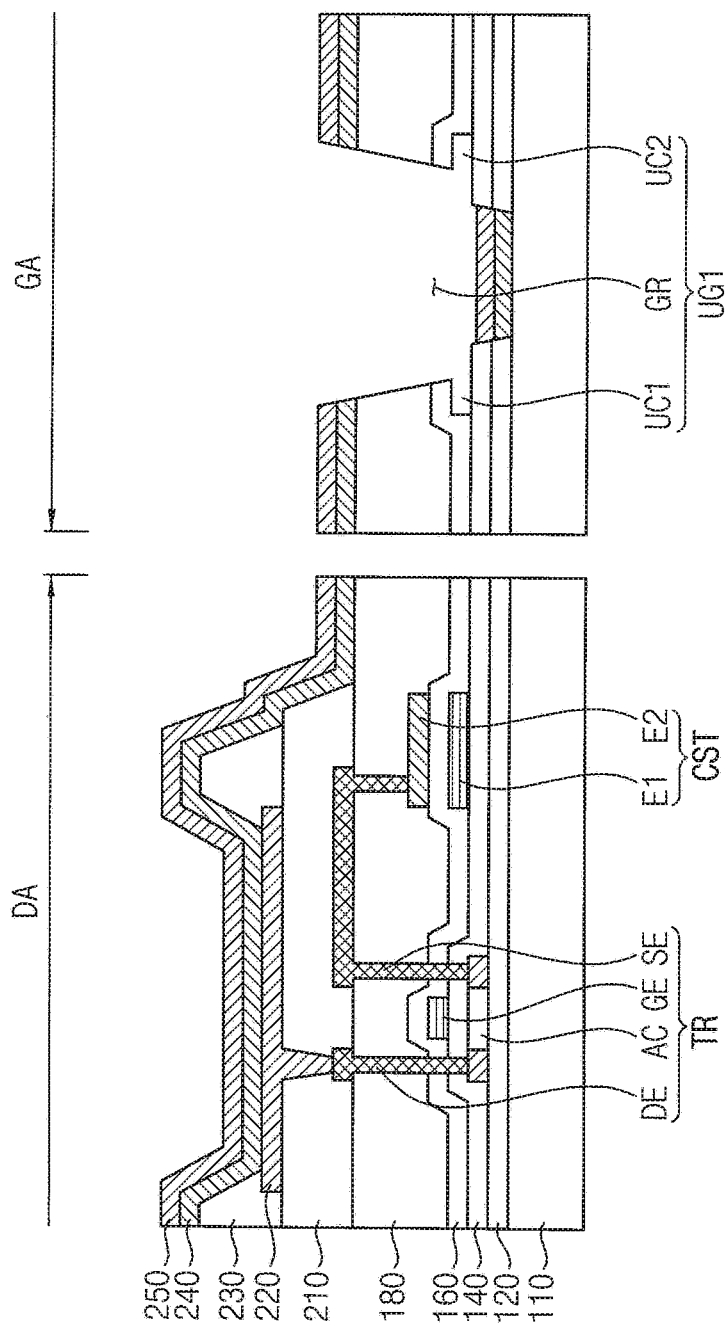

Referring to FIG. 7, through a dry etching process, the entire first and second undercut electrodes M11 and M12 may be removed through the end of the first undercut electrode M11 and the end of the second undercut electrode M12 that are exposed by the groove GR.

A first undercut UC1 (shaped and formed through using and removing the first undercut electrode M11) may be formed in the first sidewall of the groove GR, and a second undercut UC2 (shaped and formed through using and removing the second undercut electrode M12) may be formed in the second sidewall of the groove GR.

The undercut-groove UG1 may be formed in the groove area GA.

The undercut-groove UG1 may include the groove GR having a depth corresponding to thicknesses of the buffer layer 120, the first insulating layer 140, the second insulating layer 160, and the third insulating layer 180, the first undercut UC1 formed between the first insulating layer 140 and the second insulating layer 160 in the first sidewall of the groove GR, and the second undercut UC2 formed between the first insulating layer 140 and the second insulating layer 160 in the second sidewall of the groove GR.

After the undercut-groove UG1 is formed, the organic light emitting layer 240 and the common electrode layer 250 may be sequentially formed over an entire area of the base substrate 110.

The organic light emitting layer 240 and the common electrode layer 250 may be formed along the sidewall of the groove GR in the groove area GA, may be effectively broken by the undercuts UC1 and UC2, and may be formed on a bottom surface of the groove GR. Therefore, potential contaminants such as moisture and oxygen of the external air can be prevented from being introduced into the display area DA along the organic light emitting layer 240 that is formed of an organic material.

Hereinafter, elements that are the same as above-described elements may be designated with the same reference numerals, and associated descriptions may not be repeated.

Figure 8:
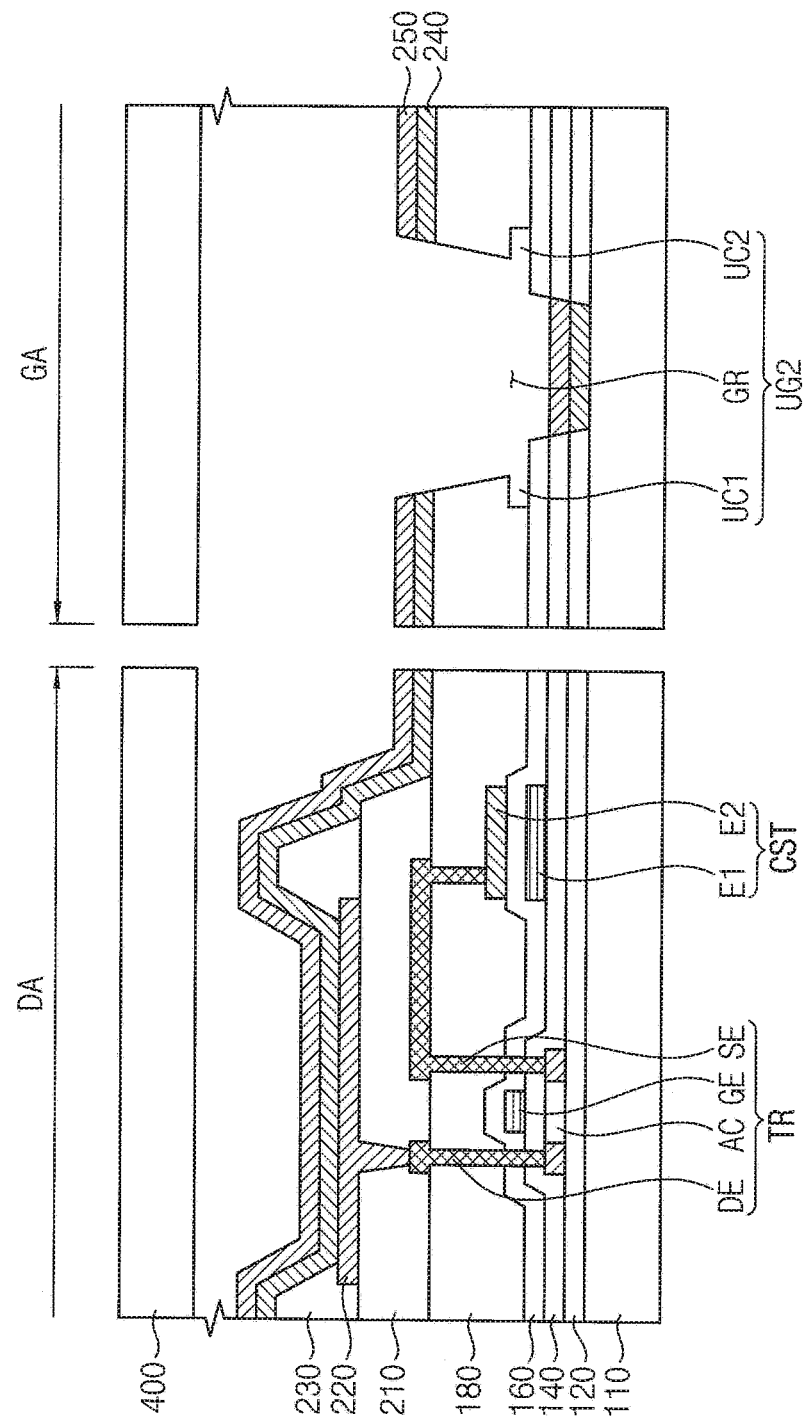
FIG. 8 is a cross-sectional diagram for describing a display device according to example embodiments.

FIG. 8 is a cross-sectional diagram for describing a display device according to example embodiments.

Referring to FIG. 8, the display device according to one embodiment may include the transistor TR, the storage capacitor CST, the pixel electrode 220, the organic light emitting layer 240, and the common electrode layer 250 disposed in the display area DA, and may include an undercut-groove UG2 disposed in the groove area GA which is the non-display area NDA.

The undercut-groove UG2 includes a groove GR formed by removing the buffer layer 120, the first insulating layer 140, the second insulating layer 160, and the second insulating layer 140. The undercut-groove UG2 includes a first undercut UC1 formed between the second insulating layer 160 and the third insulating layer 180 in the first sidewall of the groove GR, and a second undercut UC2 formed between the second insulating layer 160 and the third insulating layer 180 in the second sidewall of the groove GR.

Figure 9:
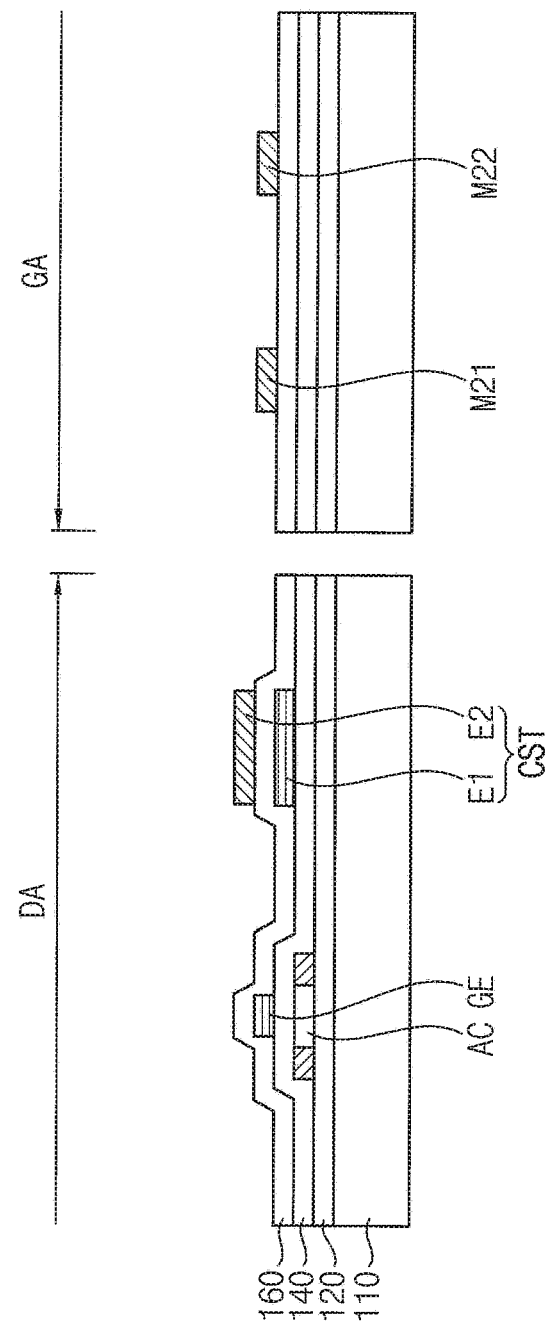
FIG. 9, FIG. 10, and FIG. 11 are cross-sectional diagrams illustrating structures formed in a method of manufacturing the display device of FIG. 8.
Figure 10:
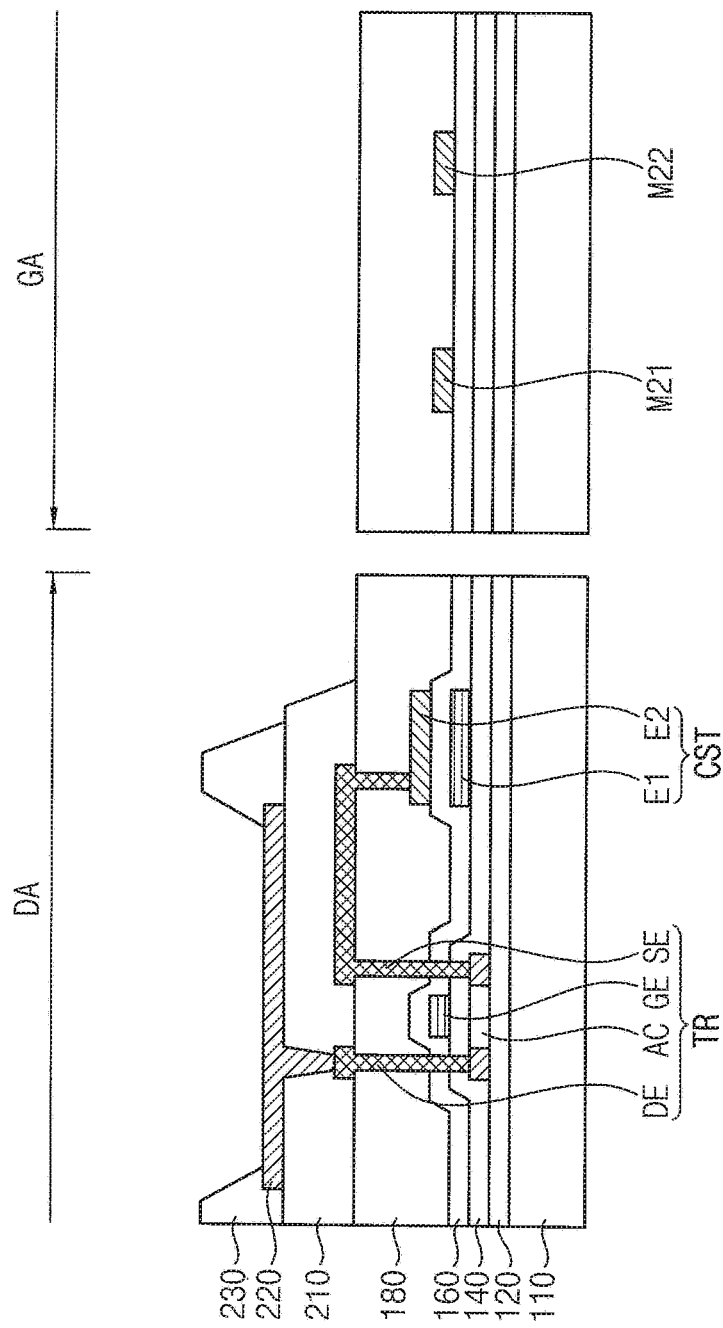
Figure 11:
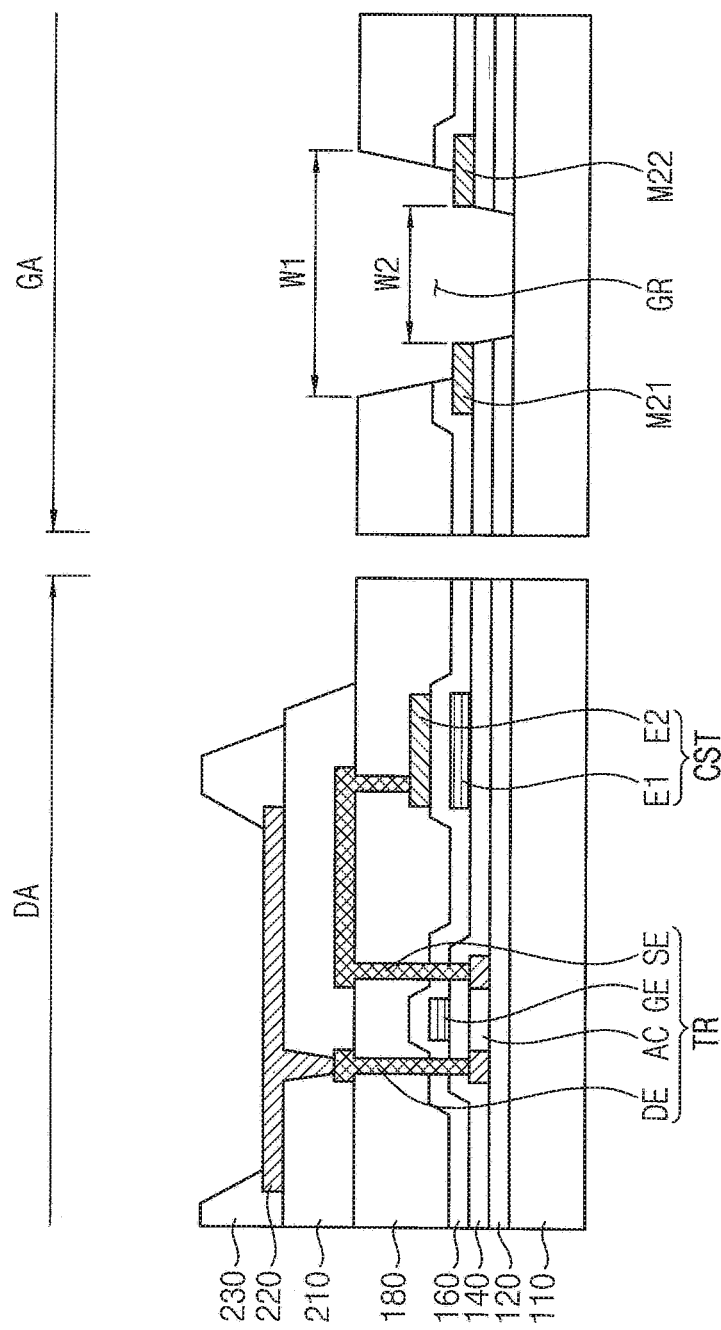

FIGS. 9 to 11 are cross-sectional diagrams for describing a method of manufacturing the display device of FIG. 8.

Referring to FIG. 9, the buffer layer 120 may be formed on the base substrate 110. The semiconductor layer AC is formed on the buffer layer 120.

The first insulating layer 140 is formed on the base substrate 110 on which the semiconductor layer AC is formed.

The first conductive layer is formed on the first insulating layer 140, and first conductive patterns GE and E1 are formed by patterning the first conductive layer. The first conductive patterns GE and E1 include the gate electrode GE and the first capacitor electrode E1 of the storage capacitor CST formed in the display area DA.

The second insulating layer 160 is formed on the base substrate 110 on which the first conductive patterns GE and E1 are formed.

The second conductive layer is formed on the base substrate 110 on which the second insulating layer 160 is formed, and second conductive patterns E2, M21, and M22 are formed by patterning the second conductive layer.

The second conductive patterns E2, M21, and M22 may include the second capacitor electrode E2 of the storage capacitor CST formed in the display area DA, and may include a first undercut electrode M21 and a second undercut electrode M22 formed in the groove area GA which is the non-display area NDA.

The first undercut electrode M21 and the second undercut electrode M22 may be spaced apart from each other.

After the second conductive patterns E2, M21, and M22 are formed, impurities are doped into the semiconductor layer AC by using the gate electrode GE as a mask. Accordingly, the semiconductor layer AC may be divided into the source region, the channel region, and the drain region.

Referring to FIG. 10, the third insulating layer 180 is formed on the base substrate 110 on which the second conductive patterns E2, M21, and M22 are formed. The contact holes are formed by simultaneously etching the first, second, and third insulating layers 140, 160, and 180.

The third conductive layer is formed on the base substrate 110 on which the contact holes are formed, and the third conductive patterns SE and DE are formed by patterning the third conductive layer.

The third conductive patterns SE and DE may include the source electrode SE and the drain electrode DE of the transistor TR formed in the display area DA. The source electrode SE may be connected to the source region of the semiconductor layer AC through the contact hole, and the drain electrode DE may be connected to the drain region of the semiconductor layer AC through the contact hole. In addition, the transistor TR may be connected to the second capacitor electrode E2 of the storage capacitor CST through the contact hole.

The fourth insulating layer 210 is formed on the base substrate 110 on which the third conductive patterns SE and DE are formed. The contact hole configured to expose the drain electrode DE of the transistor TR is formed by patterning the fourth insulating layer 210.

The pixel electrode 220 is formed by depositing a conductive material such as metal or transparent conductive oxide on the fourth insulating layer 210 having the contact hole, and patterning the deposited conductive material.

The fifth insulating layer 230 is formed on the base substrate 110 on which the pixel electrode 220 is formed, and the opening configured to expose the pixel electrode 220 is formed by patterning the fifth insulating layer 230. The opening may define the light emitting area of the pixel P.

Referring to FIG. 11, after the fifth insulating layer 230 is formed in the display area DA, the groove GR is formed in the groove area GA through an etching process.

The groove GR is formed by removing the buffer layer 120, the first insulating layer 140, the second insulating layer 160, and the second insulating layer 140 between the first undercut electrode M21 and the second undercut electrode M22.

The groove GR is configured to expose an end of the first undercut electrode M21 and an end of the second undercut electrode M22.

The groove GR may include an upper region in which the third insulating layer 180 is removed and a lower region in which the buffer layer 120, the first insulating layer 140, and the second insulating layer 160 are removed about the first undercut electrode M21 and the second undercut electrode M22. The upper region of the groove GR may have a first width W1, and the lower region of the groove GR may have a second width W2 that is smaller than the first width W1.

Referring to FIG. 8, through a dry etching process, the entire first and second undercut electrodes M21 and M22 may be removed through the end of the first undercut electrode M21 and the end of the second undercut electrode M22 that are exposed by the groove GR.

A first undercut UC1 formed by removing the first undercut electrode M21 may be formed in the first sidewall of the groove GR, and a second undercut UC2 formed by removing the second undercut electrode M22 may be formed in the second sidewall of the groove GR.

The undercut-groove UG2 may be formed in the groove area GA.

The undercut-groove UG2 may include the groove GR having a depth corresponding to thicknesses of the buffer layer 120, the first insulating layer 140, the second insulating layer 160, and the third insulating layer 180, the first undercut UC1 formed between the second insulating layer 160 and the third insulating layer 180 in the first sidewall of the groove GR, and the second undercut UC2 formed between the second insulating layer 160 and the third insulating layer 180 in the second sidewall of the groove GR.

After the undercut-groove UG2 is formed, the organic light emitting layer 240 and the common electrode layer 250 may be sequentially formed over the entire area of the base substrate 110.

The organic light emitting layer 240 and the common electrode layer 250 may be formed along the sidewall of the groove GR in the groove area GA, may be effectively broken by the undercuts UC1 and UC2, and may be formed on the bottom surface of the groove GR. Therefore, the potential contaminants such as moisture and oxygen of the external air can be prevented from being introduced into the display area DA along the organic light emitting layer 240 that is formed of an organic material.

Figure 12:
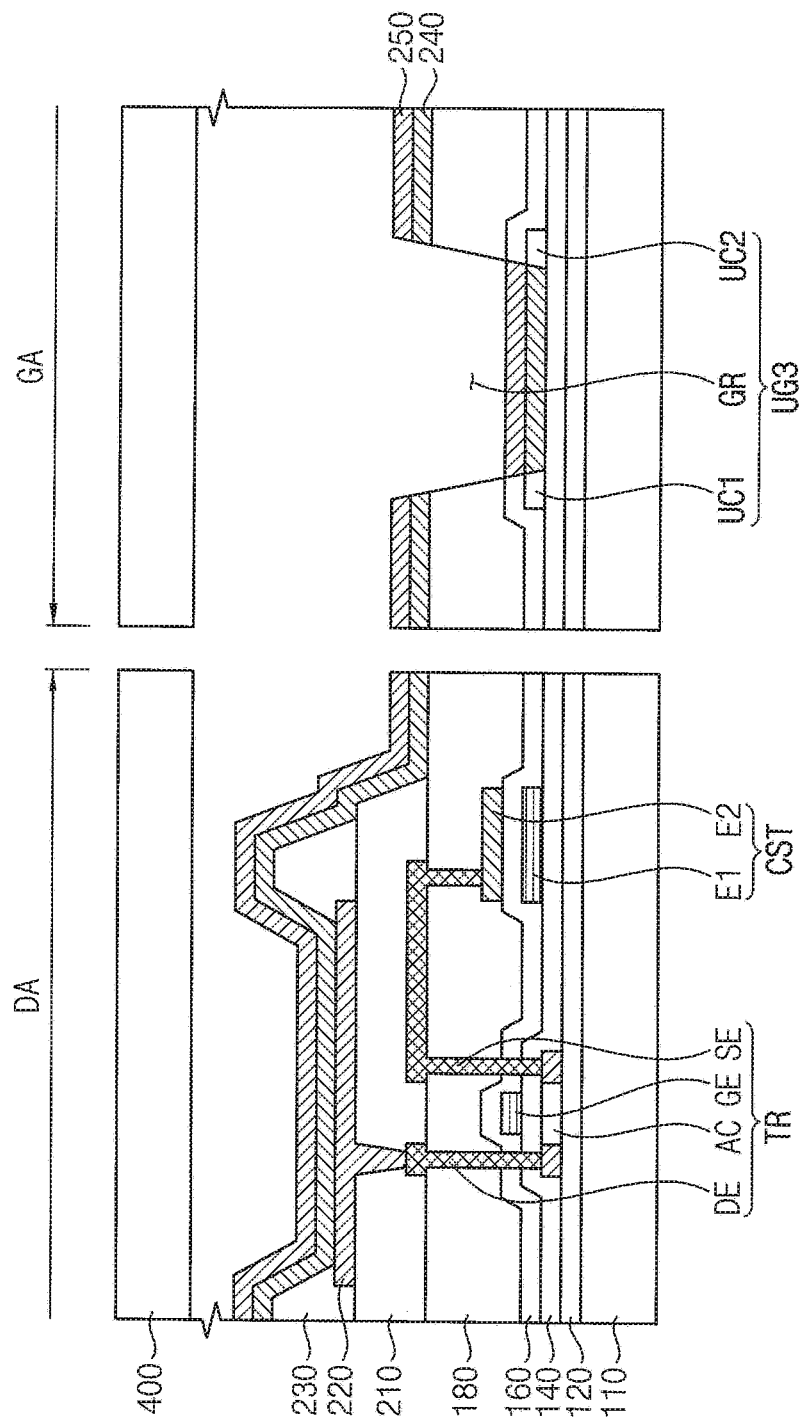
FIG. 12 is a cross-sectional diagram for describing a display device according to example embodiments.

FIG. 12 is a cross-sectional diagram for describing a display device according to example embodiments.

Referring to FIG. 12, the display device according to one embodiment may include the transistor TR, the storage capacitor CST, the pixel electrode 220, the organic light emitting layer 240, and the common electrode layer 250 disposed in the display area DA, and may include an undercut-groove UG3 disposed in the groove area GA which is the non-display area NDA.

The undercut-groove UG3 includes a first undercut UC1 formed in the first sidewall adjacent to the bottom surface of the groove GR, and a second undercut UC2 formed in the second sidewall adjacent to the bottom surface of the groove GR.

The bottom surface of the groove GR may be a top surface of the first insulating layer 140. The first undercut UC1 may be formed between the first insulating layer 140 and the second insulating layer 160 in the first sidewall adjacent to the bottom surface of the groove GR, and the second undercut UC2 may be formed between the first insulating layer 140 and the second insulating layer 160 in the second sidewall adjacent to the bottom surface of the groove GR.

Figure 13:
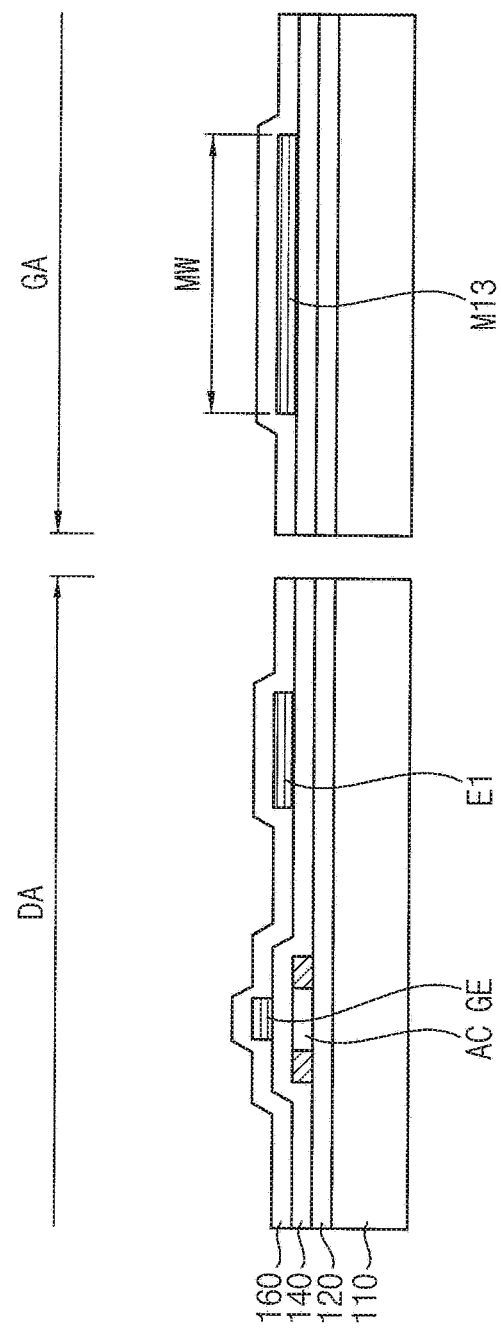
FIG. 13, FIG. 14, and FIG. 15 are cross-sectional diagrams illustrating structures formed in a method of manufacturing the display device of FIG. 12.
Figure 14:
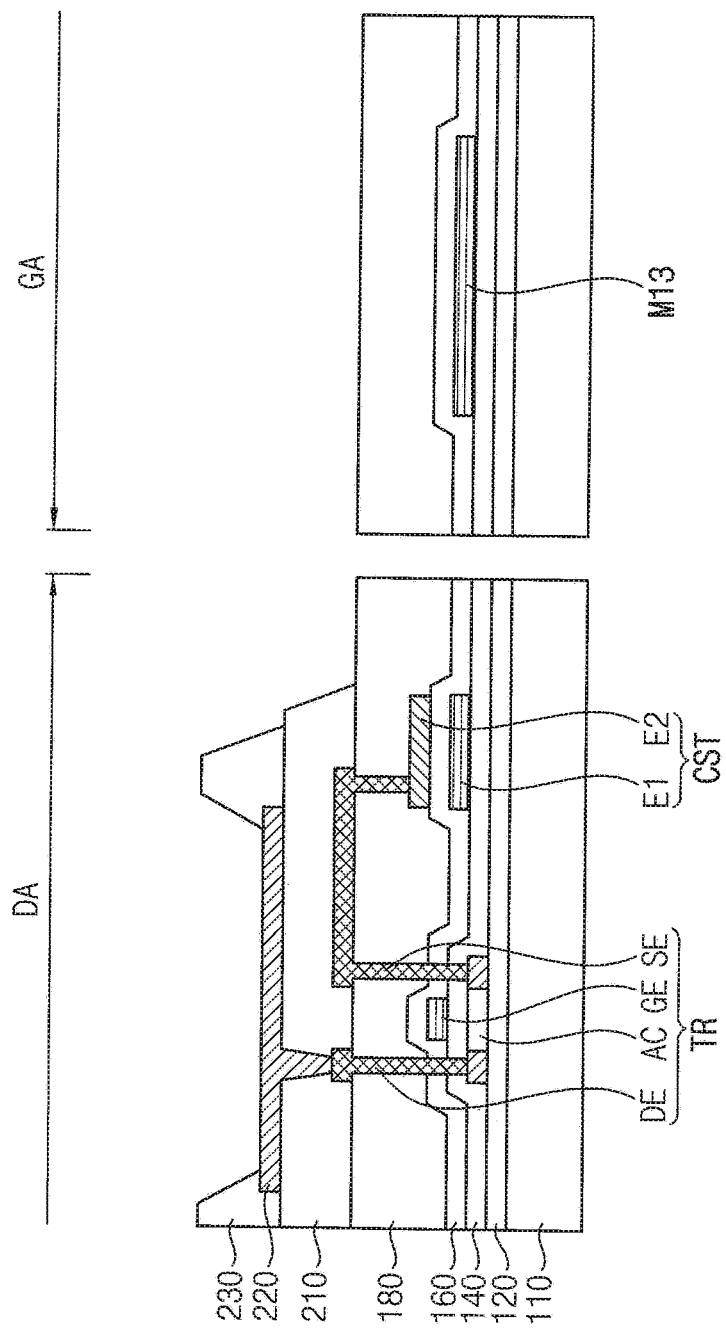
Figure 15:
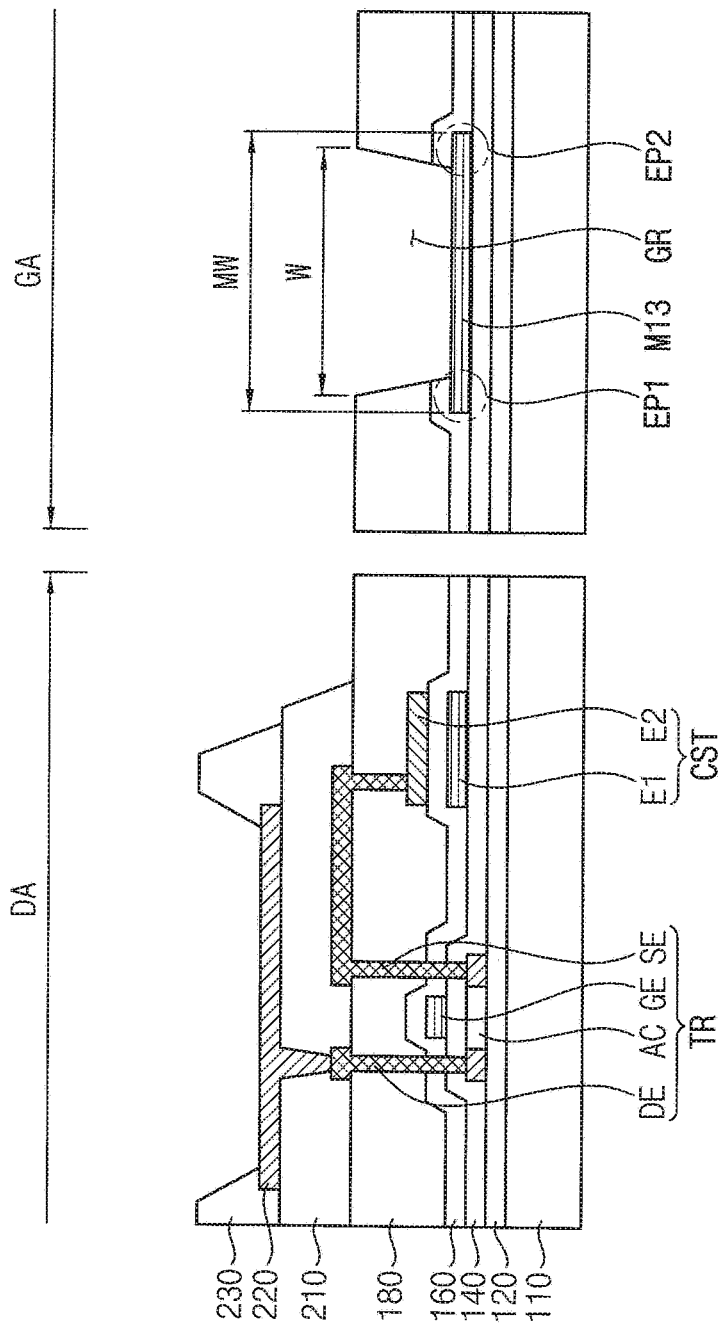

FIGS. 13 to 15 are cross-sectional diagrams for describing a method of manufacturing the display device of FIG. 12.

Referring to FIG. 13, the buffer layer 120 may be formed on the base substrate 110. The semiconductor layer AC is formed on the buffer layer 120.

The first insulating layer 140 is formed on the base substrate 110 on which the semiconductor layer AC is formed.

The first conductive layer is formed on the first insulating layer 140, and first conductive patterns GE, E1, and M13 are formed by patterning the first conductive layer. The first conductive patterns GE, E1, and M13 may include the gate electrode GE and the first capacitor electrode E1 of the storage capacitor CST formed in the display area DA, and may include an undercut electrode M13 formed in the groove area GA which is the non-display area NDA.

The undercut electrode M13 may have a width MW corresponding to the width of the groove GR which will be formed in the subsequent process.

The second insulating layer 160 is formed on the base substrate 110 on which the first conductive patterns GE, E1, and M13 are formed.

Referring to FIG. 14, the second conductive layer is formed on the base substrate 110 on which the second insulating layer 160 is formed, and the second conductive pattern E2 is formed by patterning the second conductive layer. The second conductive pattern E2 may include the second capacitor electrode E2 of the storage capacitor CST formed in the display area DA.

After the second conductive pattern E2 is formed, impurities are doped into the semiconductor layer AC by using the gate electrode GE as a mask. Accordingly, the semiconductor layer AC may be divided into the source region, the channel region, and the drain region.

The third insulating layer 180 is formed on the base substrate 110 on which the second conductive pattern E2 is formed. The contact holes are formed by simultaneously etching the first, second, and third insulating layers 140, 160, and 180.

The third conductive layer is formed on the base substrate 110 on which the contact holes are formed, and the third conductive patterns SE and DE are formed by patterning the third conductive layer.

The third conductive patterns SE and DE may include the source electrode SE and the drain electrode DE of the transistor TR formed in the display area DA. The source electrode SE may be connected to the source region of the semiconductor layer AC through the contact hole, and the drain electrode DE may be connected to the drain region of the semiconductor layer AC through the contact hole. In addition, the transistor TR may be connected to the second capacitor electrode E2 of the storage capacitor CST through the contact hole.

The fourth insulating layer 210 is formed on the base substrate 110 on which the third conductive patterns SE and DE are formed. The contact hole configured to expose the drain electrode DE of the transistor TR is formed by patterning the fourth insulating layer 210.

The pixel electrode 220 is formed by depositing a conductive material such as metal or transparent conductive oxide on the fourth insulating layer 210 having the contact hole, and patterning the deposited conductive material.

The fifth insulating layer 230 is formed on the base substrate 110 on which the pixel electrode 220 is formed, and the opening configured to expose the pixel electrode 220 is formed by patterning the fifth insulating layer 230. The opening may define the light emitting area of the pixel P.

Referring to FIG. 15, after the fifth insulating layer 230 is formed in the display area DA, the groove GR is formed in the groove area GA through an etching process.

The groove GR may be formed by removing the second insulating layer 160 and the third insulating layer 180 which are located on an upper portion about the undercut electrode M13.

The groove GR is configured to expose a top surface of the undercut electrode M13 without exposing a first end EP1 and a second end EP2 of the undercut electrode M13.

Referring to FIG. 12, through the dry etching process, the entire undercut electrode M13 may be removed through the top surface of the undercut electrode M13 that is exposed by the groove GR.

A first undercut UC1 formed by removing the first end EP1 of the undercut electrode M13 may be formed in the first sidewall of the groove GR, and a second undercut UC2 formed by removing the second end EP2 of the undercut electrode M13 may be formed in the second sidewall of the groove GR.

The undercut-groove UG3 may be formed in the groove area GA.

The undercut-groove UG3 may include the groove GR having a depth corresponding to thicknesses of the undercut electrode M13, the second insulating layer 160, and the third insulating layer 180, the first undercut UC1 formed between the first insulating layer 140 and the second insulating layer 160 in the first sidewall adjacent to the bottom surface of the groove GR, and the second undercut UC2 formed between the first insulating layer 140 and the second insulating layer 160 in the second sidewall adjacent to the bottom surface of the groove GR. The bottom surface of the groove GR may be the top surface of the first insulating layer 140.

After the undercut-groove UG3 is formed, the organic light emitting layer 240 and the common electrode layer 250 may be sequentially formed over the entire area of the base substrate 110.

The organic light emitting layer 240 and the common electrode layer 250 may be formed along the sidewall of the groove GR in the groove area GA, may be effectively broken by the undercuts UC1 and UC2, and may be formed on the bottom surface of the groove GR. Therefore, potential contaminants such as moisture and oxygen of the external air can be prevented from being introduced into the display area DA along the organic light emitting layer 240 that is formed of an organic material.

Figure 16:
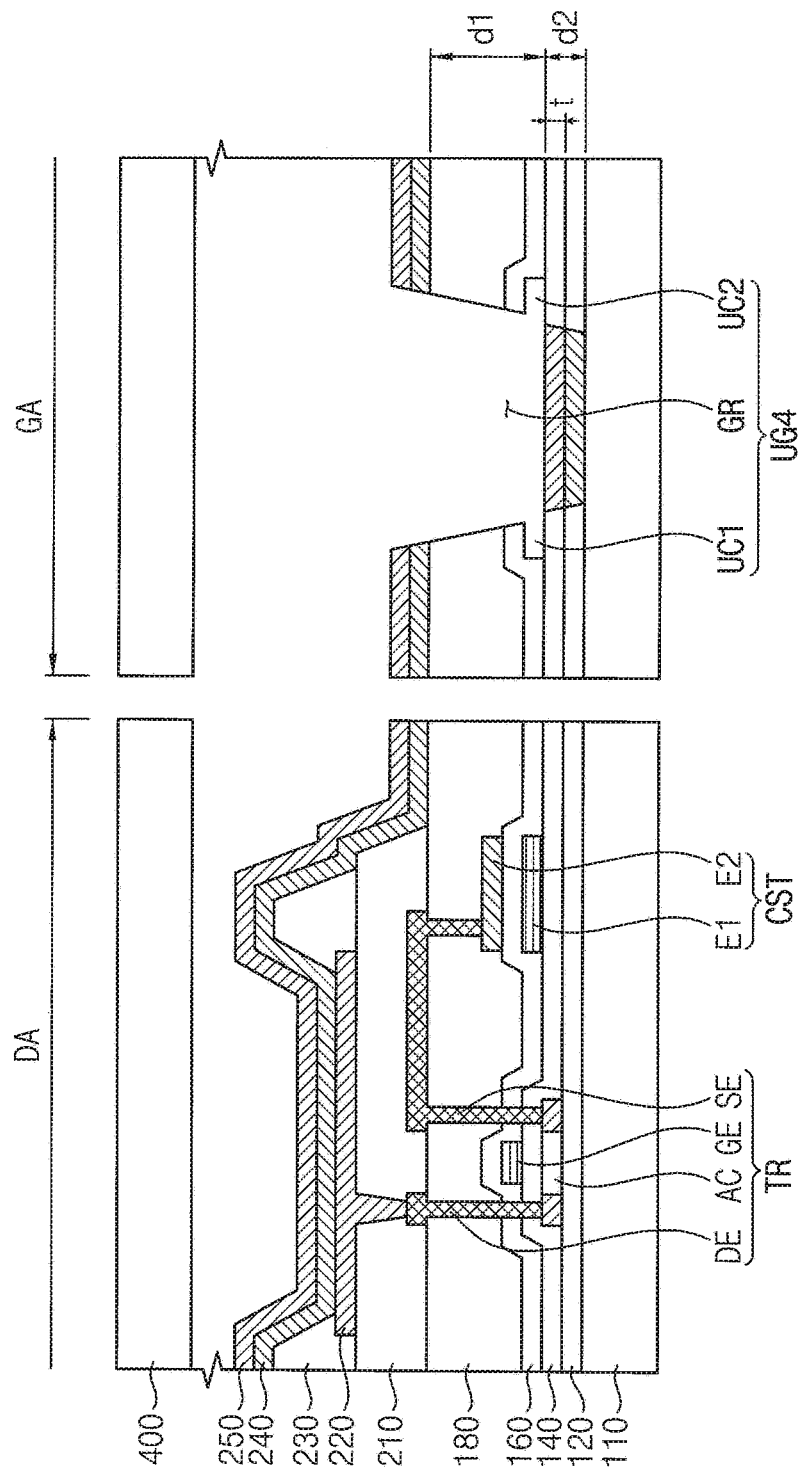
FIG. 16 is a cross-sectional diagram illustrating a structure formed in a method of manufacturing a display device according to example embodiments.

FIG. 16 is a cross-sectional diagram for describing a method of manufacturing a display device according to example embodiments.

Referring to FIG. 16, the display device according to one embodiment may include an undercut-groove UG4 disposed in the groove area GA.

The method of manufacturing the display device including the undercut-groove UG4 may include steps of the method of manufacturing the display device according to the previous embodiment described with reference to FIGS. 12 to 15.

With reference to FIGS. 12 to 15, after the fifth insulating layer 230 is formed in the display area DA, the groove GR is formed in the groove area GA through the etching process.

The groove GR may be formed by removing the second insulating layer 160 and the third insulating layer 180 which are located on the upper portion about the undercut electrode M13.

Next, through a first dry etching process, the entire undercut electrode M13 may be removed through the top surface of the undercut electrode M13 that is exposed by the groove GR.

Referring to FIG. 16, a first undercut UC1 formed by removing the first end EP1 of the undercut electrode M13 may be formed in the first sidewall of the groove GR, and a second undercut UC2 formed by removing the second end EP2 of the undercut electrode M13 may be formed in the second sidewall of the groove GR.

Next, through a second dry etching process, the buffer layer 120 and the first insulating layer 140 exposed to the removed undercut electrode M13 are etched. Since the buffer layer 120 and the first insulating layer 140 are removed, the groove GR may become deeper corresponding to a thickness of the buffer layer 120 and a thickness t of the first insulating layer 140.

According to this embodiment, the groove GR may include an upper region having a first depth d1 corresponding to thicknesses of the second insulating layer 160 and the third insulating layer 180, and a lower region having a second depth d2 corresponding to thicknesses of the buffer layer 120 and the first insulating layer 140 under the first and second undercuts UC1 and UC2.

After the undercut-groove UG4 is formed, the organic light emitting layer 240 and the common electrode layer 250 may be sequentially formed over the entire area of the base substrate 110.

The organic light emitting layer 240 and the common electrode layer 250 may be formed along the sidewall of the groove GR in the groove area GA, may be effectively broken by the undercuts UC1 and UC2, and may be formed on the bottom surface of the groove GR. Therefore, potential contaminants such as moisture and oxygen of the external air can be prevented from being introduced into the display area DA along the organic light emitting layer 240 that is formed of an organic material.

Figure 17:
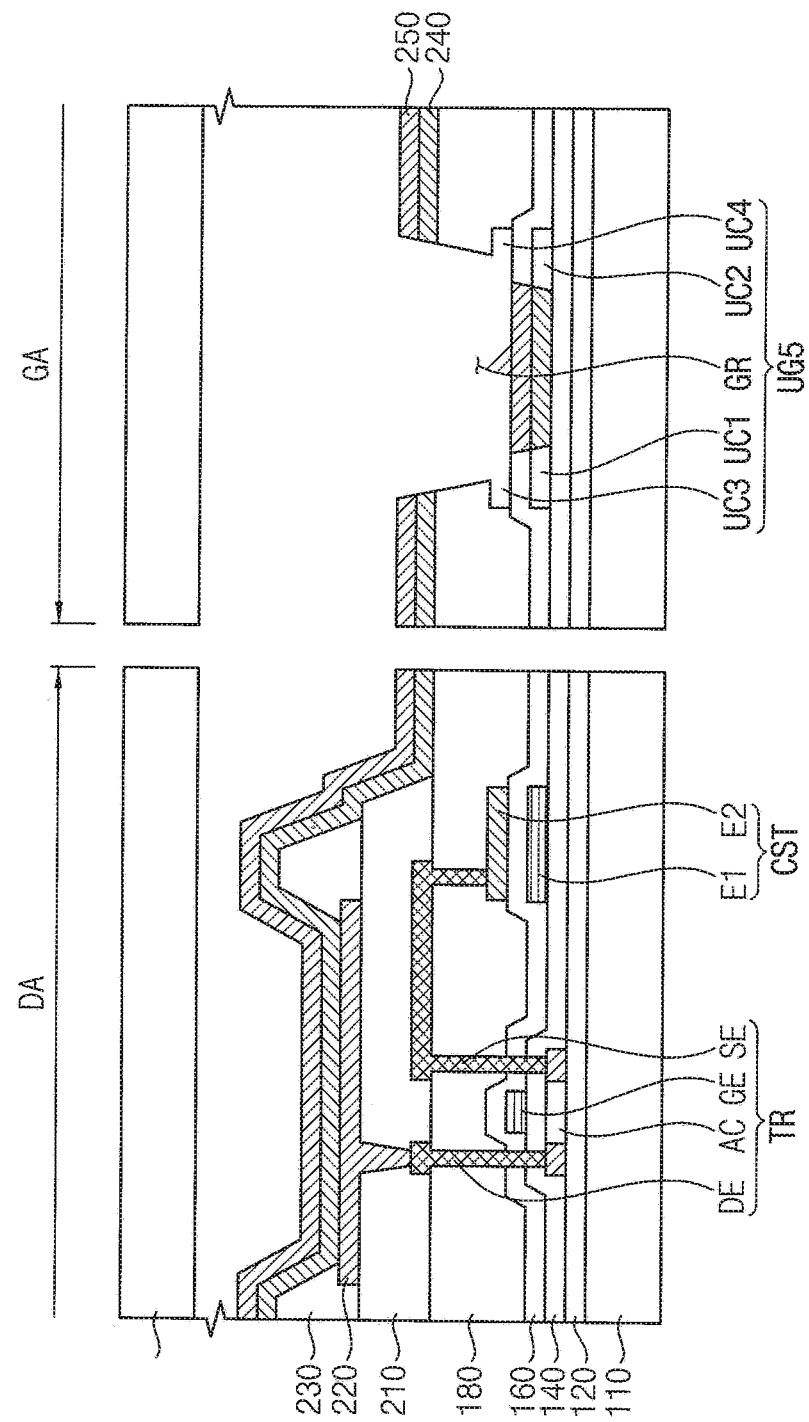
FIG. 17 is a cross-sectional diagram for describing a display device according to example embodiments.

FIG. 17 is a cross-sectional diagram for describing a display device according to example embodiments.

Referring to FIG. 17, the display device according to one embodiment may include the transistor TR, the storage capacitor CST, the pixel electrode 220, the organic light emitting layer 240, and the common electrode layer 250 disposed in the display area DA, and may include an undercut-groove UG5 disposed in the groove area GA which is the non-display area NDA.

The undercut-groove UG5 includes a groove GR formed by removing the second insulating layer 160 and the third insulating layer 180. The undercut-groove UG5 includes a first undercut UC1, a second undercut UC2, a third undercut UC3, and a fourth undercut UC4 which are formed on the sidewall of the groove GR.

The first undercut UC1 is formed between the first insulating layer 140 and the second insulating layer 160 in the first sidewall of the groove GR, the second undercut UC2 is formed between the first insulating layer 140 and the second insulating layer 160 in the second sidewall of the groove GR, the third undercut UC3 is formed between the second insulating layer 160 and the third insulating layer 180 in the first sidewall of the groove GR, and the fourth undercut UC4 is formed between the second insulating layer 160 and the third insulating layer 180 in the second sidewall of the groove GR.

The undercut-groove UG5 may include the groove GR, the first and third undercuts UC1 and UC3 formed in the first sidewall of the groove GR, and the second and fourth undercuts UC2 and UC4 formed in the second sidewall of the groove GR.

Figure 18:
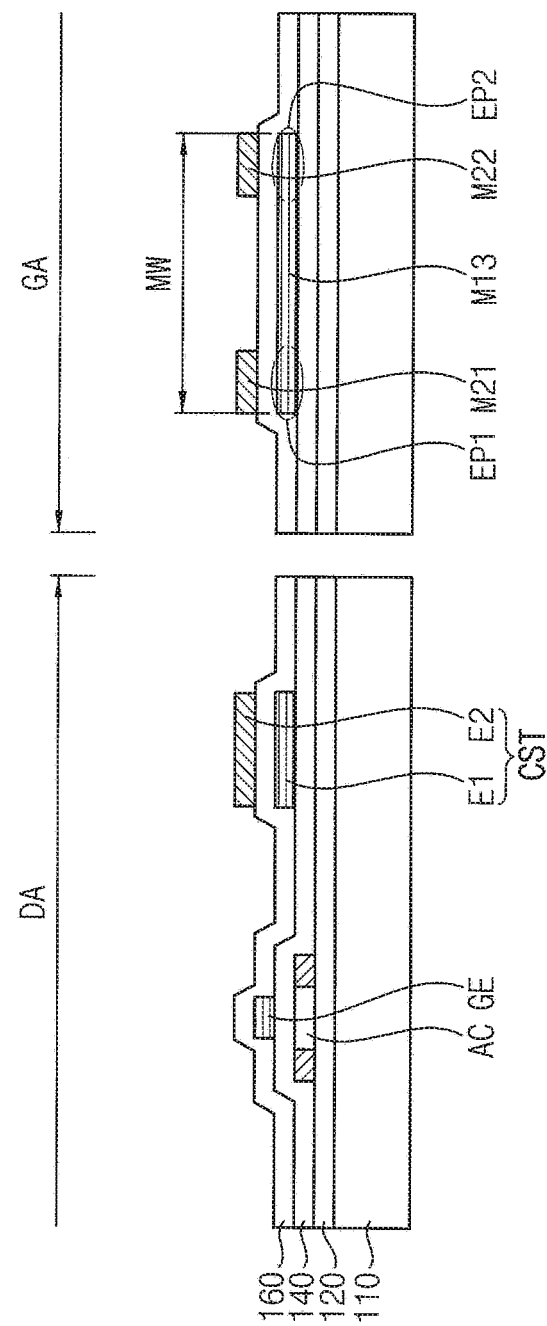
FIG. 18, FIG. 19, and FIG. 20 are cross-sectional diagrams illustrating structures formed in a method of manufacturing the display device of FIG. 17 according to example embodiments.
Figure 19:
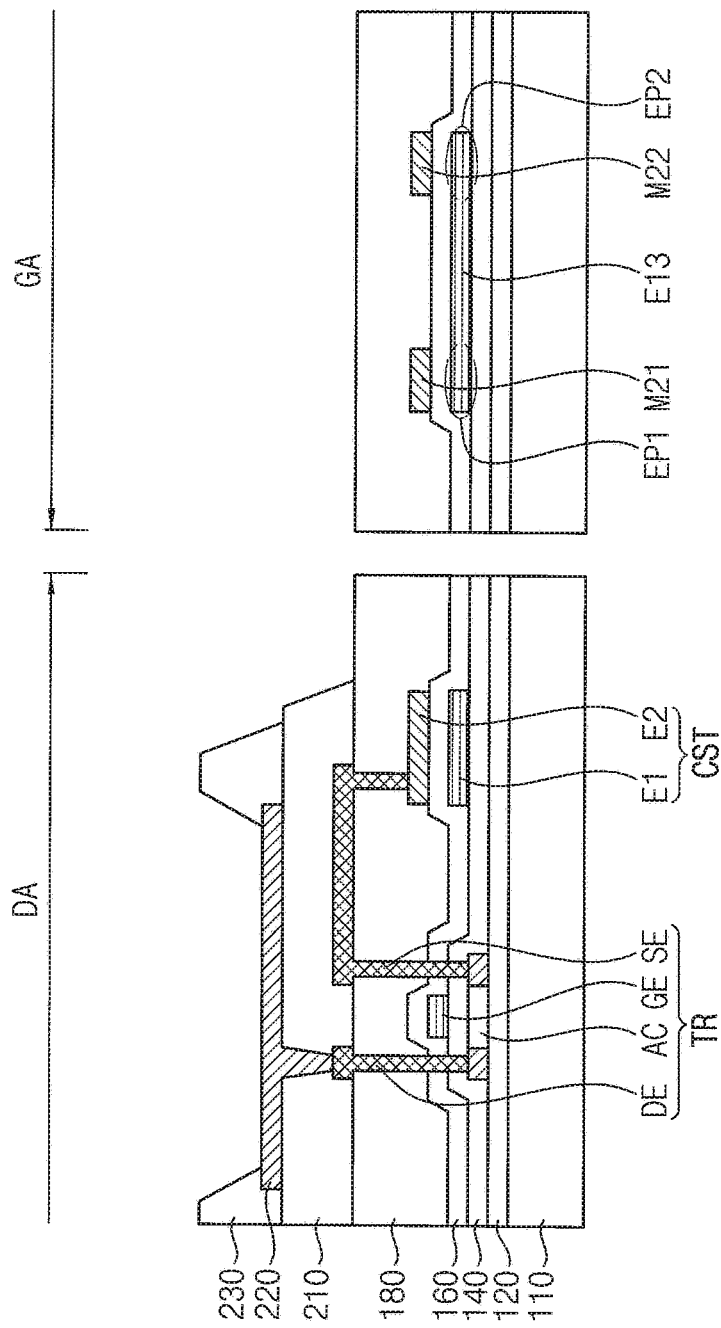
Figure 20:
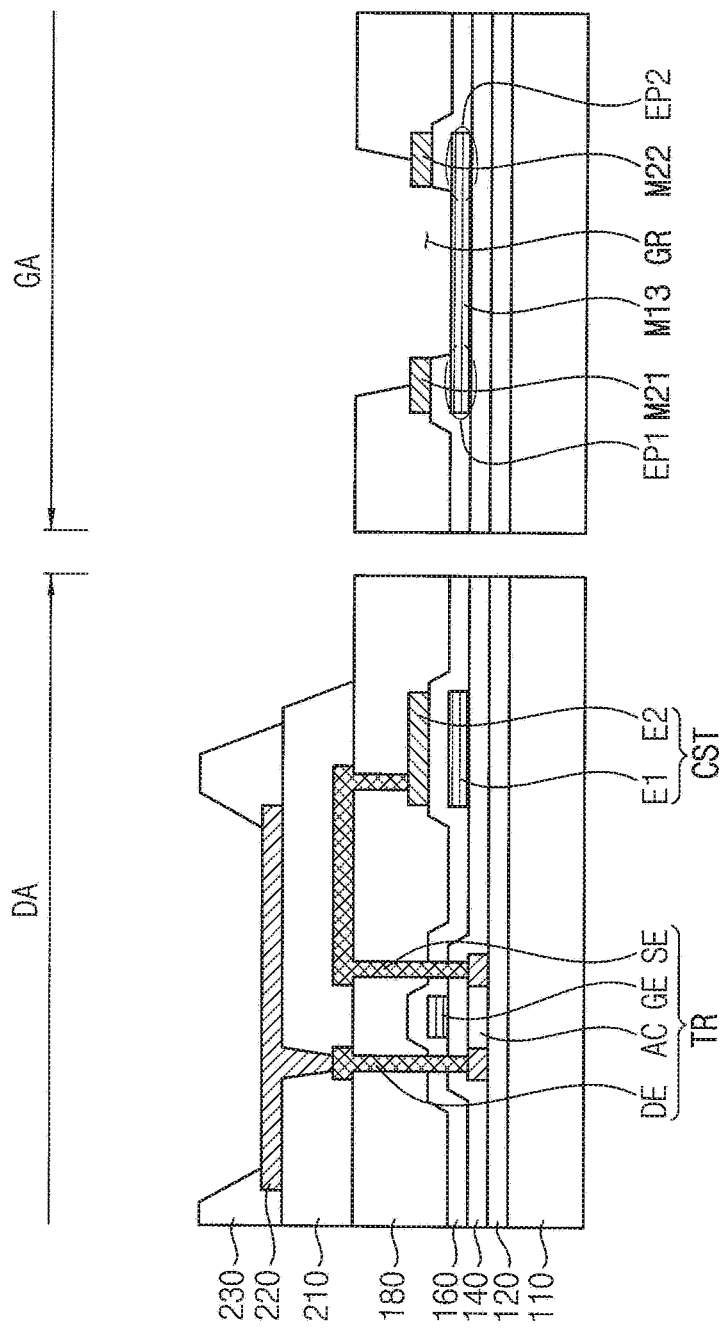

FIGS. 18 to 20 are cross-sectional diagrams for describing a method of manufacturing the display device of FIG. 17.

Referring to FIG. 18, the buffer layer 120 may be formed on the base substrate 110. The semiconductor layer AC is formed on the buffer layer 120.

The first insulating layer 140 is formed on the base substrate 110 on which the semiconductor layer AC is formed.

The first conductive layer is formed on the first insulating layer 140, and first conductive patterns GE, E1, and M13 are formed by patterning the first conductive layer. The first conductive patterns GE, E1, and M13 may include the gate electrode GE and the first capacitor electrode E1 of the storage capacitor CST formed in the display area DA, and may include a first undercut electrode M13 formed in the groove area GA which is the non-display area NDA. The first undercut electrode M13 may have a width MW corresponding to the width of the groove GR which will be formed in the subsequent process.

The second insulating layer 160 is formed on the base substrate 110 on which first conductive patterns GE, E1, and M13 are formed.

The second conductive layer is formed on the second insulating layer 160, and second conductive patterns E2, M21, and M22 are formed by patterning the second conductive layer. The second conductive patterns E2, M21, and M22 may include the second capacitor electrode E2 of the storage capacitor CST formed in the display area DA, and may include a second undercut electrode M21 and a third undercut electrode M22 spaced apart from the second undercut electrode M21 formed in the groove area GA which is the non-display area NDA. The second undercut electrode M21 may overlap a first end EP1 of the first undercut electrode M13, and the third undercut electrode M22 may overlap a second end EP2 of the first undercut electrode M13.

Referring to FIG. 19, after the second conductive patterns E2, M21, and M22 are formed, impurities are doped into the semiconductor layer AC by using the gate electrode GE as a mask. Accordingly, the semiconductor layer AC may be divided into the source region, the channel region, and the drain region.

The third insulating layer 180 is formed on the base substrate 110 on which the second conductive patterns E2, M21, and M22 are formed. The contact holes are formed by simultaneously etching the first, second, and third insulating layers 140, 160, and 180.

The third conductive layer is formed on the base substrate 110 on which the contact holes are formed, and the third conductive patterns SE and DE are formed by patterning the third conductive layer.

The third conductive patterns SE and DE may include the source electrode SE and the drain electrode DE of the transistor TR formed in the display area DA. The source electrode SE may be connected to the source region of the semiconductor layer AC through the contact hole, and the drain electrode DE may be connected to the drain region of the semiconductor layer AC through the contact hole. In addition, the transistor TR may be connected to the second capacitor electrode E2 of the storage capacitor CST through the contact hole.

The fourth insulating layer 210 is formed on the base substrate 110 on which the third conductive patterns SE and DE are formed. The contact hole configured to expose the drain electrode DE of the transistor TR is formed by patterning the fourth insulating layer 210.

The pixel electrode 220 is formed by depositing a conductive material such as metal or transparent conductive oxide on the fourth insulating layer 210 having the contact hole, and patterning the deposited conductive material.

The fifth insulating layer 230 is formed on the base substrate 110 on which the pixel electrode 220 is formed, and the opening configured to expose the pixel electrode 220 is formed by patterning the fifth insulating layer 230. The opening may define the light emitting area of the pixel P.

Referring to FIG. 20, after the fifth insulating layer 230 is formed in the display area DA, the groove GR is formed in the groove area GA through the etching process.

The groove GR may be formed by removing the second insulating layer 160 located on a lower portion and the third insulating layer 180 located on an upper portion about the second undercut electrode M21 and the third undercut electrode M22.

Meanwhile, the insulating layer 160 located under the first end EP1 of the first undercut electrode M13 and the insulating layer 160 located under the second end EP2 of the first undercut electrode M13 are not etched.

The groove GR is configured to expose a portion of a top surface of the first undercut electrode M13 and to expose ends of the second undercut electrode M21 and the third undercut electrode M22.

Referring to FIGS. 17 and 20, through the dry etching process, the entire undercut electrode M13 may be removed through the top surface of the undercut electrode M13 that is exposed by the groove GR. In addition, through the dry etching process, the entire second and third undercut electrodes M21 and M22 may be removed through the ends of the second undercut electrode M21 and the third undercut electrode M22 that are exposed by the groove GR.

A first undercut UC1 formed by removing the first end EP1 of the first undercut electrode M13 and a third undercut UC3 formed by removing the second undercut electrode M21 may be formed in the first sidewall of the groove GR. In addition, a second undercut UC2 formed by removing the second end EP2 of the first undercut electrode M13 and a fourth undercut UC4 formed by removing the third undercut electrode M22 may be formed in the second sidewall of the groove GR.

The undercut-groove UG5 may be formed in the groove area GA.

The undercut-groove UG5 may include the groove GR having a depth corresponding to thicknesses of the first undercut electrode M13, the second insulating layer 160, and the third insulating layer 180, may include the first undercut UC1 formed between the second insulating layer 160 protruding from the first sidewall of the groove GR and the first insulating layer 140 and the third undercut UC3 formed between the second insulating layer 160 protruding from the first sidewall of the groove GR and the third insulating layer 180, and may include the second undercut UC2 formed between the second insulating layer 160 protruding from the second sidewall of the groove GR and the first insulating layer 140 and the fourth undercut UC4 formed between the second insulating layer 160 protruding from the second sidewall of the groove GR and the third insulating layer 180.

After the undercut-groove UG5 is formed, the organic light emitting layer 240 and the common electrode layer 250 may be sequentially formed over the entire area of the base substrate 110.

The organic light emitting layer 240 and the common electrode layer 250 may be formed along the sidewall of the groove GR in the groove area GA, may be effectively broken by the undercuts UC1, UC2, UC3, and UC4, and may be formed on the bottom surface of the groove GR. Therefore, the potential contaminants such as moisture and oxygen of the external air can be prevented from being introduced into the display area DA along the organic light emitting layer 240 that is formed of an organic material.

Figure 21:
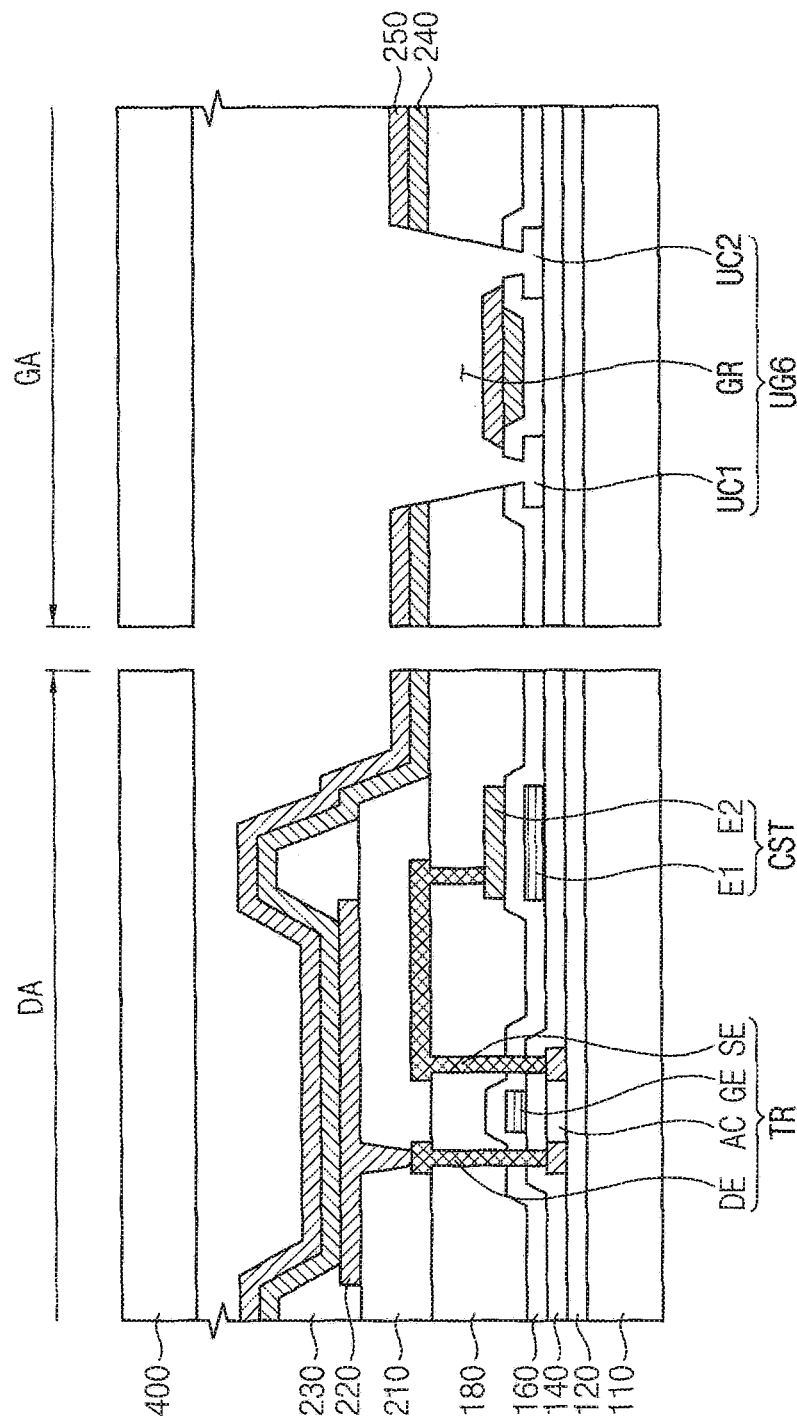
FIG. 21 is a cross-sectional diagram for describing a display device according to example embodiments.

FIG. 21 is a cross-sectional diagram for describing a display device according to example embodiments.

Referring to FIG. 21, the display device according to one embodiment may include the transistor TR, the storage capacitor CST, the pixel electrode 220, the organic light emitting layer 240, and the common electrode layer 250 disposed in the display area DA, and may include an undercut-groove UG6 disposed in the groove area GA which is the non-display area NDA.

The undercut-groove UG6 includes a groove GR formed by removing the second insulating layer 160. In addition, the undercut-groove UG6 may include a first undercut UC1 located at the bottom surface adjacent to the first sidewall of the groove GR, and a second undercut UC2 located at the bottom surface adjacent to the second sidewall of the groove GR. The undercut-groove UG6 may contain a contained insulating member between the undercuts UC1 and UC2. The contained insulating member may be part of the second insulating layer 160; i.e., a material of the contained insulating member may be identical to a material of the second insulating layer 160. The contained insulating member may include two undercuts respectively opposite the undercuts UC1 and UC2.

Figure 22:
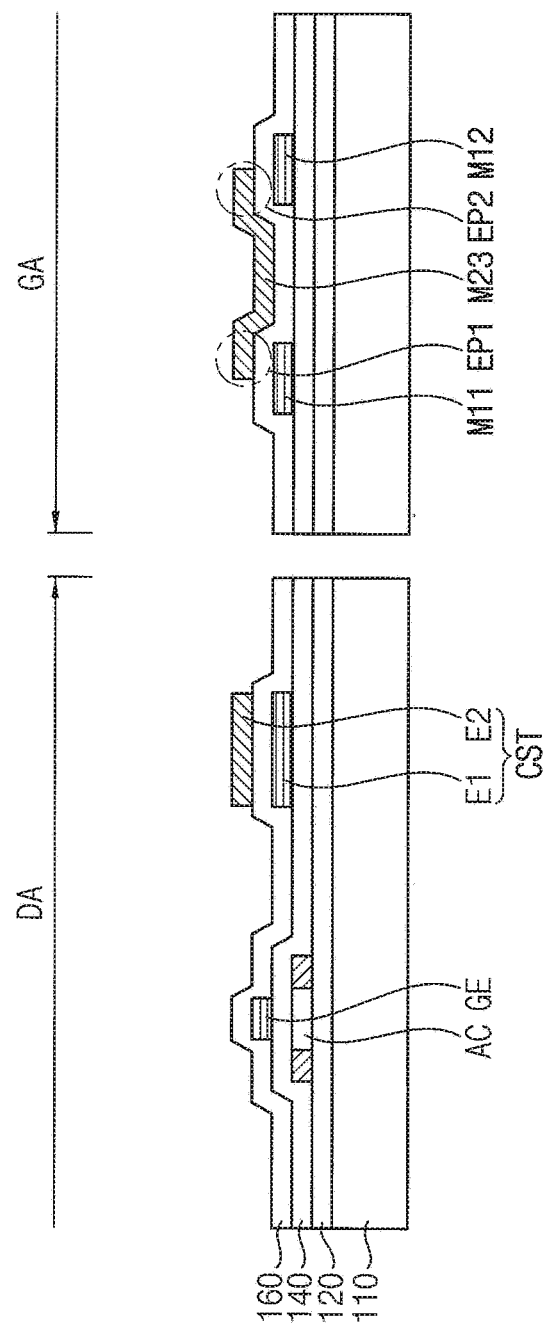
FIG. 22, FIG. 23, and FIG. 24 are cross-sectional diagrams illustrating structures formed in a method of manufacturing the display device of FIG. 21 according to example embodiments.
Figure 23:
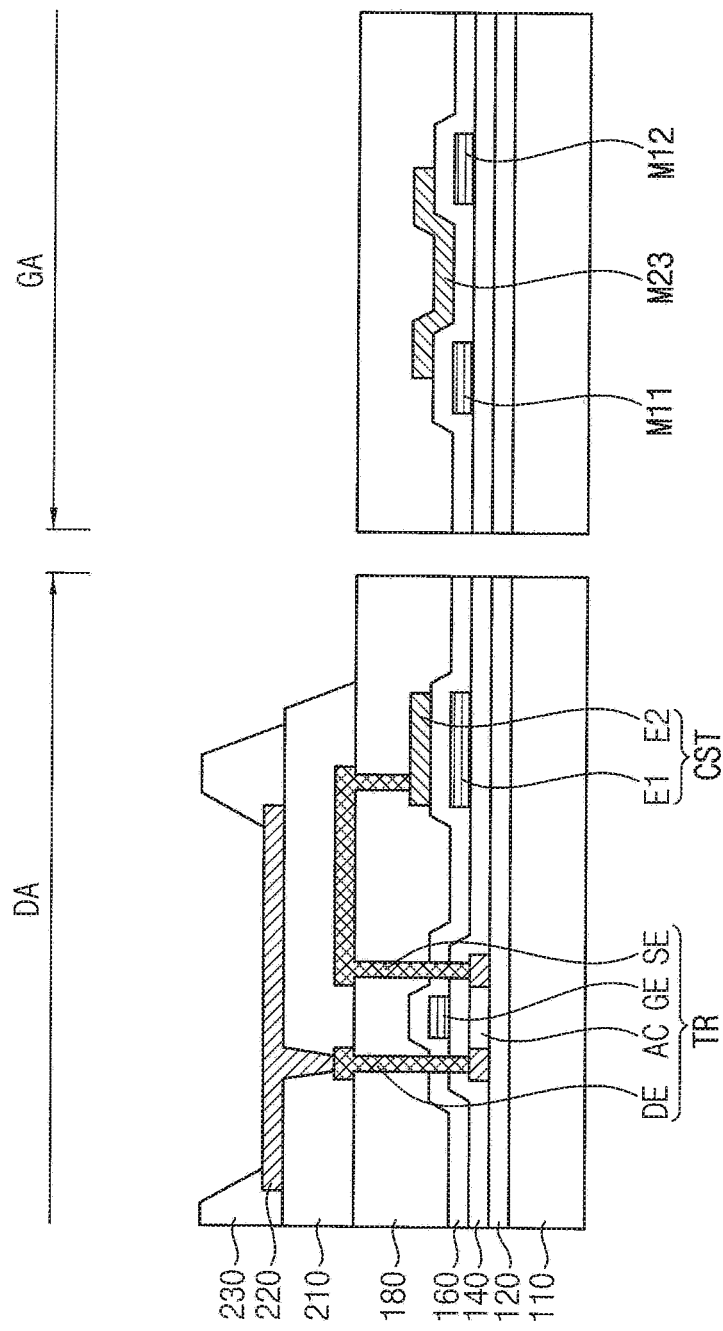
Figure 24:
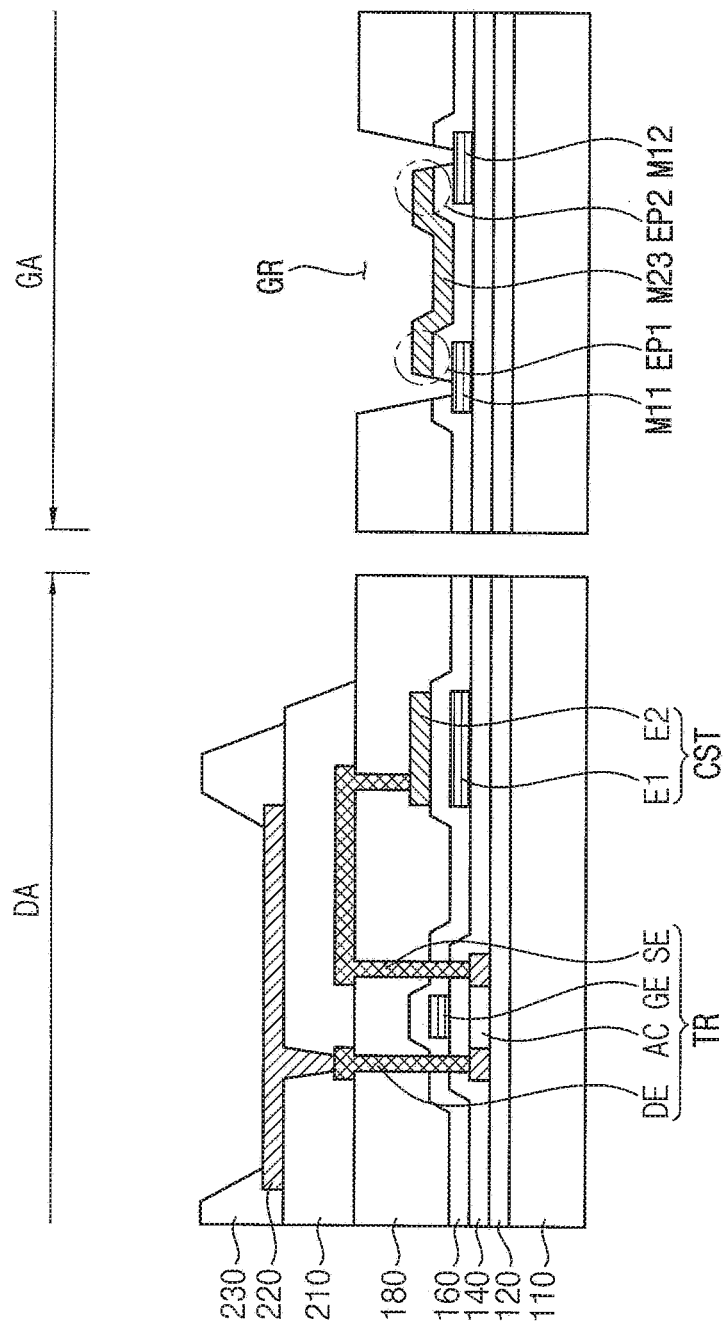

FIGS. 22 to 24 are cross-sectional diagrams for describing a method of manufacturing the display device of FIG. 21.

Referring to FIG. 22, the buffer layer 120 may be formed on the base substrate 110. The semiconductor layer AC is formed on the buffer layer 120.

The first insulating layer 140 is formed on the base substrate 110 on which the semiconductor layer AC is formed.

The first conductive layer is formed on the first insulating layer 140, and first conductive patterns GE, E1, M11, and M12 are formed by patterning the first conductive layer. The first conductive patterns GE, E1, M11, and M12 may include the gate electrode GE and the first capacitor electrode E1 of the storage capacitor CST formed in the display area DA, and may include the first undercut electrode M11 and the second undercut electrode M12 spaced apart from the first undercut electrode M11 formed in the groove area GA which is the non-display area NDA. The first undercut electrode M11 and the second undercut electrode M12 may correspond to the first and second undercuts UC1 and UC2 which will be formed in the bottom surface adjacent to the sidewall of the groove GR in the subsequent process, respectively.

The second insulating layer 160 is formed on the base substrate 110 on which the first conductive patterns GE, E1, M11, and M12 are formed.

The second conductive layer is formed on the second insulating layer 160, and second conductive patterns E2 and M23 are formed by patterning the second conductive layer.

The second conductive patterns E2 and M23 may include the second capacitor electrode E2 of the storage capacitor CST formed in the display area DA, and may include a third undercut electrode M23 formed in the groove area GA which is the non-display area NDA. The third undercut electrode M23 may be disposed in a separation region between the first and second undercut electrodes M11 and M12, a first end EP1 of the third undercut electrode M23 may partially overlap the first undercut electrode M11, and a second end EP2 of the third undercut electrode M23 may partially overlap the second undercut electrode M12.

Referring to FIG. 23, after the second conductive patterns E2 and M23 are formed, impurities are doped into the semiconductor layer AC by using the gate electrode GE as a mask. Accordingly, the semiconductor layer AC may be divided into the source region, the channel region, and the drain region.

The third insulating layer 180 is formed on the base substrate 110 on which the second conductive patterns E2 and M23 are formed. The contact holes are formed by simultaneously etching the first, second, and third insulating layers 140, 160, and 180.

The third conductive layer is formed on the base substrate 110 on which the contact holes are formed, and the third conductive patterns SE and DE are formed by patterning the third conductive layer.

The third conductive patterns SE and DE may include the source electrode SE and the drain electrode DE of the transistor TR formed in the display area DA. The source electrode SE may be connected to the source region of the semiconductor layer AC through the contact hole, and the drain electrode DE may be connected to the drain region of the semiconductor layer AC through the contact hole. In addition, the transistor TR may be connected to the second capacitor electrode E2 of the storage capacitor CST through the contact hole.

The fourth insulating layer 210 is formed on the base substrate 110 on which the third conductive patterns SE and DE are formed. The contact hole configured to expose the drain electrode DE of the transistor TR is formed by patterning the fourth insulating layer 210.

The pixel electrode 220 is formed by depositing a conductive material such as metal or transparent conductive oxide on the fourth insulating layer 210 having the contact hole, and patterning the deposited conductive material.

The fifth insulating layer 230 is formed on the base substrate 110 on which the pixel electrode 220 is formed, and the opening configured to expose the pixel electrode 220 is formed by patterning the fifth insulating layer 230. The opening may define the light emitting area of the pixel P.

Referring to FIG. 24, after the fifth insulating layer 230 is formed in the display area DA, the groove GR is formed in the groove area GA through the etching process.

The groove GR may be formed by removing the third insulating layer 180 located on an upper portion of the third undercut electrode M23, and the second insulating layer 160, which is located on an upper portion of the first undercut electrode M11 and the second undercut electrode M12 and exposed by the third undercut electrode M23.

The groove GR is configured to expose a top surface and a side surface of the third undercut electrode M23. In addition, the groove GR is configured to expose a top surface of the first undercut electrode M11, which does not overlap the first end EP1 of the third undercut electrode M23, and a top surface of the second undercut electrode M12, which does not overlap the second end EP2 of the third undercut electrode M23.

Referring to FIGS. 21 and 24, through the dry etching process, the entire third undercut electrode M23 may be removed through the top surface and the side surface of the third undercut electrode M23 exposed by the groove GR. In addition, the entire first and second undercut electrodes M11 and M12 may be removed through the top surfaces of the first undercut electrode M11 and the second undercut electrode M12 that are exposed by the groove GR.

The bottom surface of the groove GR may be formed as a top surface of the second insulating layer 160. A first undercut UC1 may be formed between the first insulating layer 140 and the second insulating layer 160 in the bottom surface adjacent to the first sidewall of the groove GR, and a second undercut UC2 may be formed between the first insulating layer 140 and the second insulating layer 160 in the bottom surface adjacent to the second sidewall of the groove GR.

The undercut-groove UG6 may be formed in the groove area GA.

The undercut-groove UG6 may include the groove GR having a depth corresponding to a thickness of the third insulating layer 180, the first undercut UC1 formed in the bottom surface adjacent to the first sidewall of the groove GR, and the second undercut UC2 formed in the bottom surface adjacent to the second sidewall of the groove GR.

After the undercut-groove UG6 is formed, the organic light emitting layer 240 and the common electrode layer 250 may be sequentially formed over the entire area of the base substrate 110.

The organic light emitting layer 240 and the common electrode layer 250 may be formed along the sidewall of the groove GR in the groove area GA, may be effectively broken by the undercuts UC1 and UC2, and may be formed on the bottom surface of the groove GR. Therefore, potential contaminants such as moisture and oxygen of the external air can be prevented from being introduced into the display area DA along the organic light emitting layer 240 that is formed of an organic material.

Figure 25:
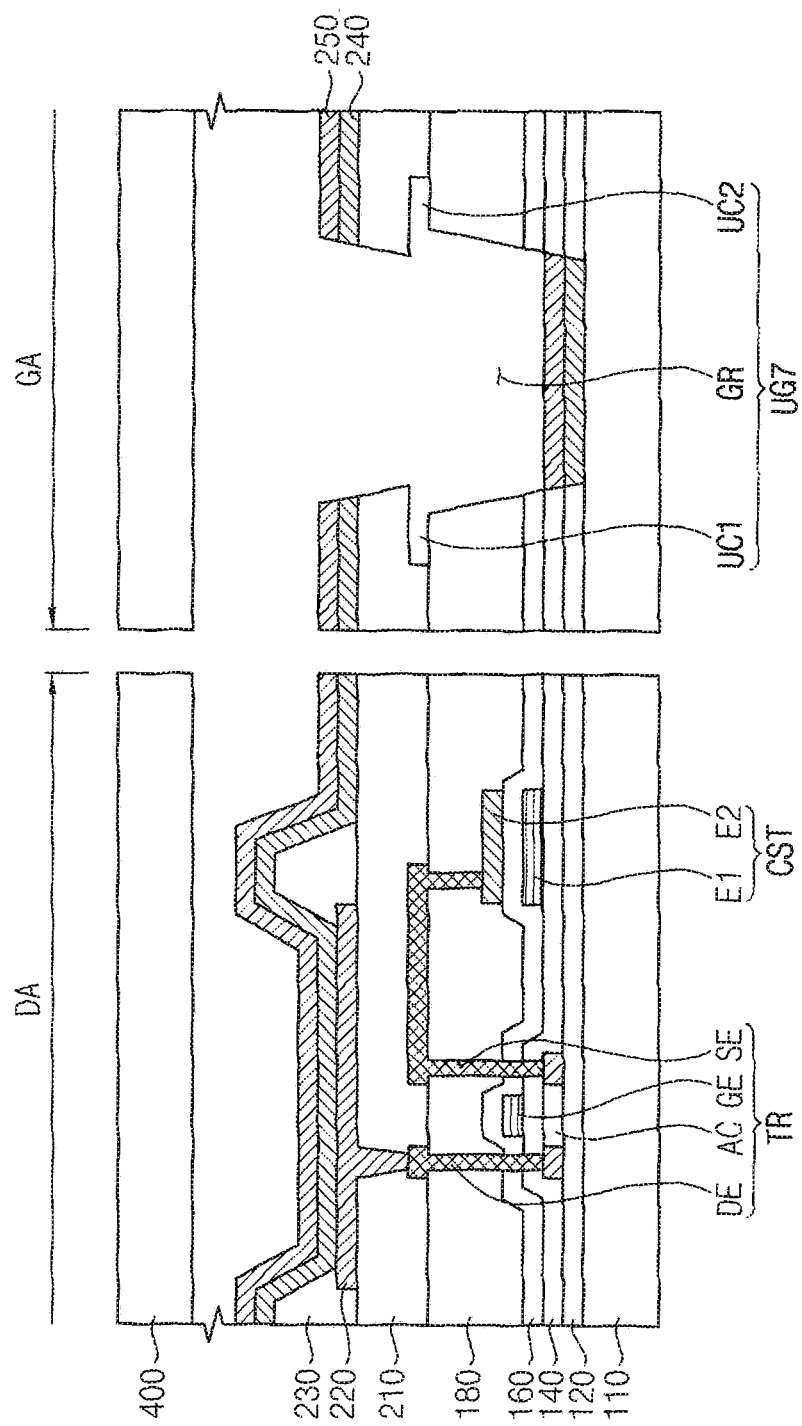
FIG. 25 is a cross-sectional diagram for describing a display device according to example embodiments.

FIG. 25 is a cross-sectional diagram for describing a display device according to example embodiments.

Referring to FIG. 25, the display device according to one embodiment may include the transistor TR, the storage capacitor CST, the pixel electrode 220, the organic light emitting layer 240, and the common electrode layer 250 disposed in the display area DA, and may include an undercut-groove UG7 disposed in the groove area GA which is the non-display area NDA.

The undercut-groove UG7 includes a groove GR formed by removing the buffer layer 120, the first insulating layer 140, the second insulating layer 160, the third insulating layer 180, and the fourth insulating layer 210. In addition, the undercut-groove UG7 includes a first undercut UC1 formed between the third insulating layer 180 and the fourth insulating layer 210 in the first sidewall of the groove GR, and a second undercut UC2 formed between the third insulating layer 180 and the fourth insulating layer 210 in the second sidewall of the groove GR.

Figure 26:
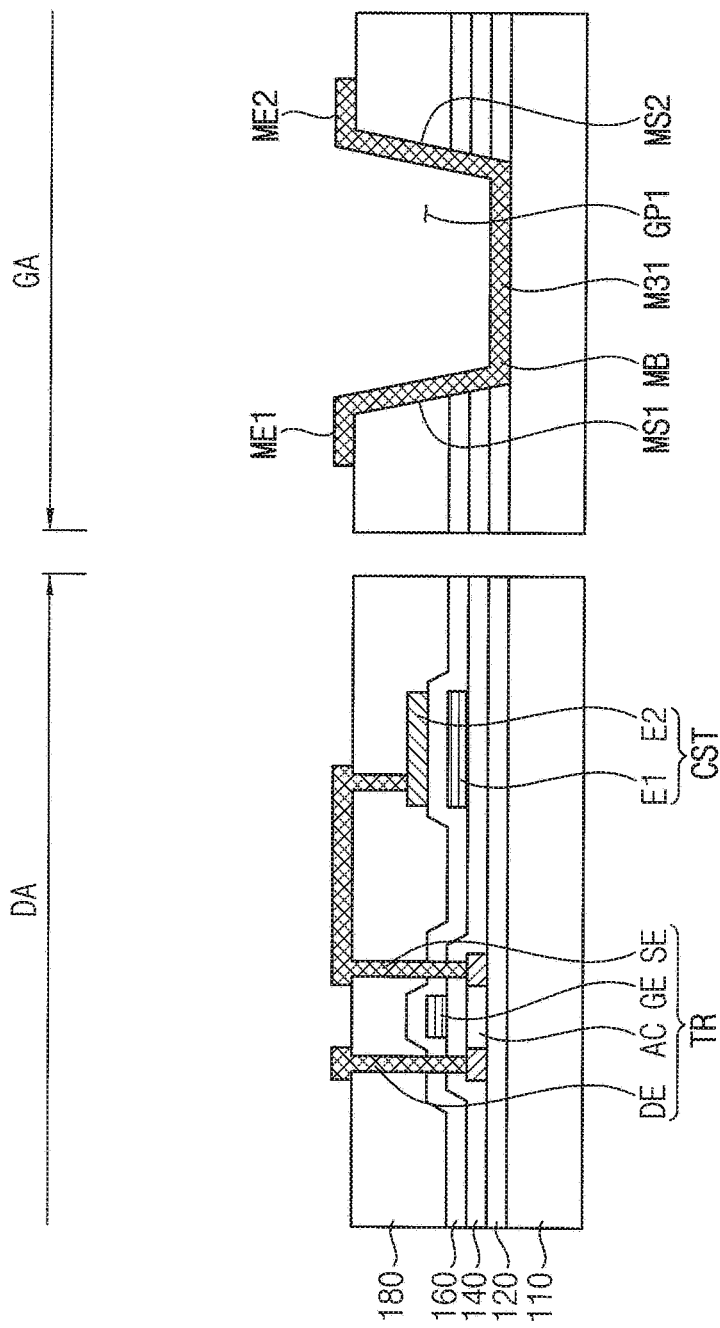
FIG. 26, FIG. 27, and FIG. 28 are cross-sectional diagrams illustrating structures formed in a method of manufacturing the display device of FIG. 25 according to example embodiments.
Figure 27:
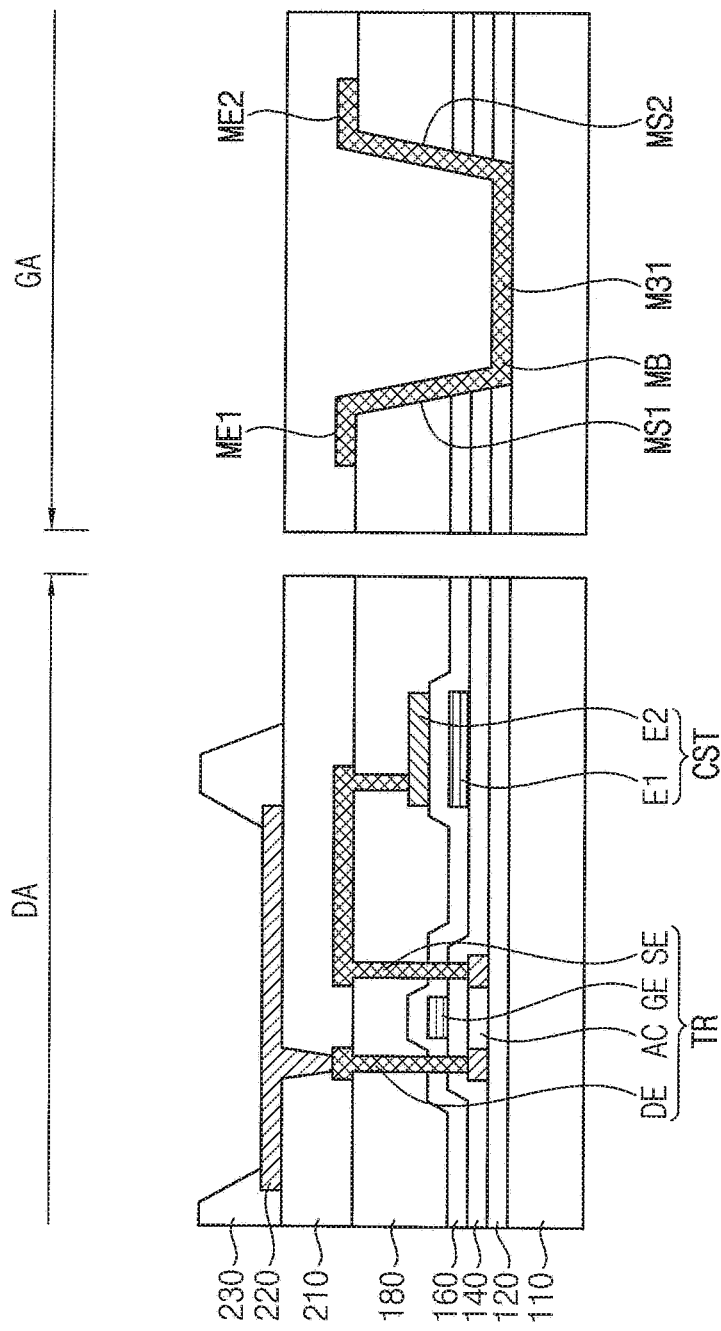
Figure 28:
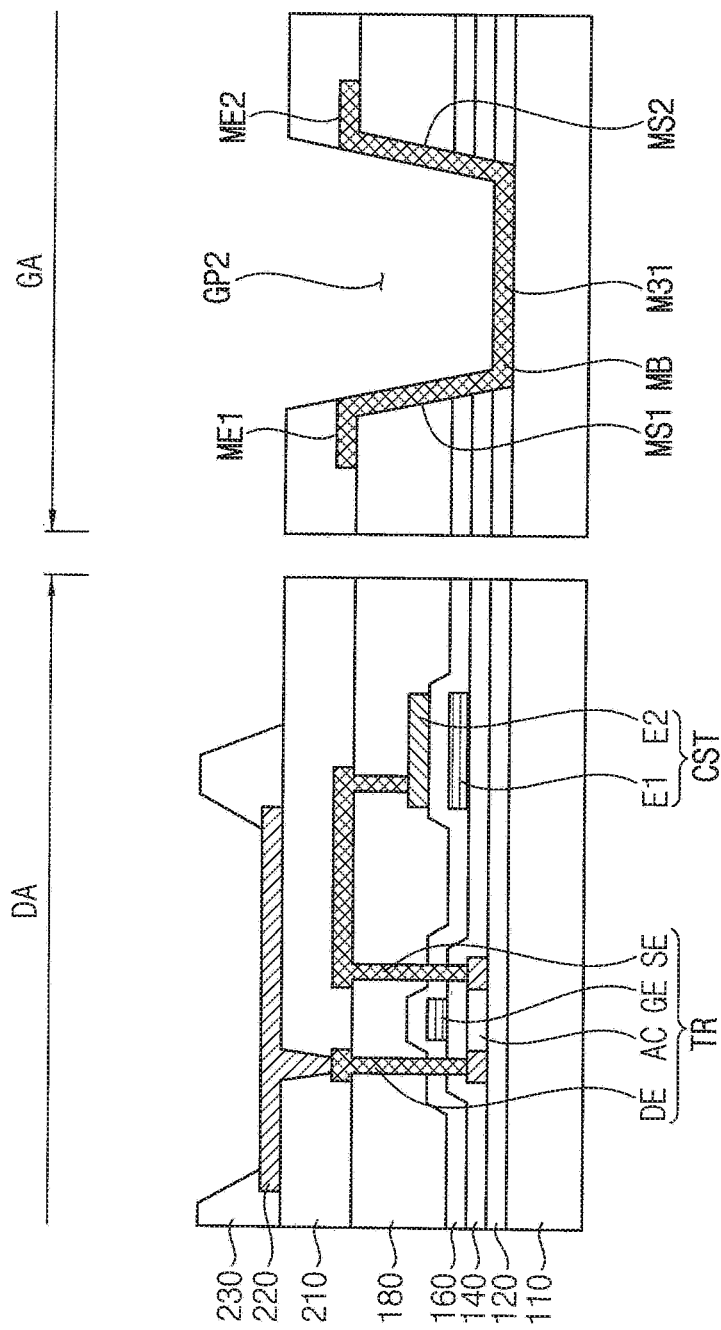

FIGS. 26 to 28 are cross-sectional diagrams for describing a method of manufacturing the display device of FIG. 25.

Referring to FIG. 26, the buffer layer 120 may be formed on the base substrate 110. The semiconductor layer AC is formed on the buffer layer 120.

The first insulating layer 140 is formed on the base substrate 110 on which the semiconductor layer AC is formed.

The first conductive layer is formed on the first insulating layer 140, and first conductive patterns GE and E1 are formed by patterning the first conductive layer. The first conductive patterns GE and E1 may include the gate electrode GE and the first capacitor electrode E1 of the storage capacitor CST formed in the display area DA.

The second insulating layer 160 is formed on the base substrate 110 on which the first conductive patterns GE and E1 are formed. The second conductive layer is formed on the second insulating layer 160, and the second conductive pattern E2 is formed by patterning the second conductive layer. The second conductive pattern E2 may include the second capacitor electrode E2 of the storage capacitor CST formed in the display area DA.

The third insulating layer 180 is formed on the base substrate 110 on which the second conductive pattern E2 is formed. A plurality of contact holes are formed in the display area DA by simultaneously etching the buffer layer 120 and the first, second, and third insulating layers 140, 160, and 180, and a first groove pattern GP1 is formed in the groove area GA which is the non-display area NDA. The contact holes in the display area DA may be formed by removing the buffer layer 120 and the first, second, and third insulating layers 140, 160, and 180 to expose the semiconductor layer AC and the second capacitor electrode E2. The first groove pattern GP1 in the groove area GA may be formed by removing the buffer layer 120, the first insulating layer 140, the second insulating layer 160, and the third insulating layer 180 to expose the base substrate 110.

The third conductive layer is formed on the base substrate 110 on which the contact holes and the first groove pattern GP1 are formed, and third conductive patterns SE, DE, and M31 are formed by patterning the third conductive layer.

The third conductive patterns SE, DE, and M31 may include the source electrode SE and the drain electrode DE of the transistor TR formed in the display area DA, and may include an undercut electrode M31 in the groove area GA.

The source electrode SE may be connected to the source region of the semiconductor layer AC through the contact hole, and the drain electrode DE may be connected to the drain region of the semiconductor layer AC through the contact hole. In addition, the transistor TR may be connected to the second capacitor electrode E2 of the storage capacitor CST through the contact hole.

The undercut electrode M31 may include a bottom MB formed on a bottom surface of the first groove pattern GP1, a first side MS1 formed on a first sidewall of the first groove pattern GP1, a second side MS2 formed on a second sidewall of the first groove pattern GP1, a first end ME1 formed on a top of the third insulating layer 180 connected to the first sidewall, and a second end ME2 formed on the top of the third insulating layer 180 connected to the second sidewall.

Referring to FIG. 27, the fourth insulating layer 210 is formed on the base substrate 110 on which the third conductive patterns SE, DE, and M31 are formed. The contact hole configured to expose the drain electrode DE of the transistor TR is formed by patterning the fourth insulating layer 210.

The pixel electrode 220 is formed by depositing a conductive material such as metal or transparent conductive oxide on the fourth insulating layer 210 having the contact hole, and patterning the deposited conductive material.

The fifth insulating layer 230 is formed on the base substrate 110 on which the pixel electrode 220 is formed, and the opening configured to expose the pixel electrode 220 is formed by patterning the fifth insulating layer 230. The opening may define the light emitting area of the pixel P.

Referring to FIG. 28, a second groove pattern GP2 configured to expose the bottom MB, the first side MS1, and the second side MS2 of the undercut electrode M31 is formed by patterning the fourth insulating layer 210 formed in the groove area GA of the non-display area NDA.

Referring to FIGS. 25 and 28, through the dry etching process, the entire undercut electrode M31 may be removed through the bottom MB, the first side MS1, and the second side MS2 of the undercut electrode M31 exposed by the second groove pattern GP2 in the groove area GA.

Accordingly, in the groove area GA, a groove GR corresponding to the second groove pattern GP2 may be formed, the first undercut UC1 may be formed between the third insulating layer 180 and the fourth insulating layer 210 in the first sidewall of the groove GR by the first end ME1 of the undercut electrode M31, and the second undercut UC2 may be formed between the third insulating layer 180 and the fourth insulating layer 210 in the second sidewall of the groove GR by the second end ME2 of the undercut electrode M31.

The undercut-groove UG7 may be formed in the groove area GA.

The undercut-groove UG7 may include the groove GR having a depth corresponding to thicknesses of the buffer layer 120, the first insulating layer 140, the second insulating layer 160, the third insulating layer 180, and the fourth insulating layer 210, the first undercut UC1 formed between the third insulating layer 180 and the fourth insulating layer 210 in the first sidewall of the groove GR, and the second undercut UC2 formed between the third insulating layer 180 and the fourth insulating layer 210 in the second sidewall of the groove GR.

After the undercut-groove UG7 is formed, the organic light emitting layer 240 and the common electrode layer 250 may be sequentially formed over the entire area of the base substrate 110.

The organic light emitting layer 240 and the common electrode layer 250 may be formed along the sidewall of the groove GR in the groove area GA, may be effectively broken by the undercuts UC1 and UC2, and may be formed on the bottom surface of the groove GR. Therefore, potential contaminants such as moisture and oxygen of the external air can be prevented from being introduced into the display area DA along the organic light emitting layer 240 that is formed of an organic material.

Figure 29:
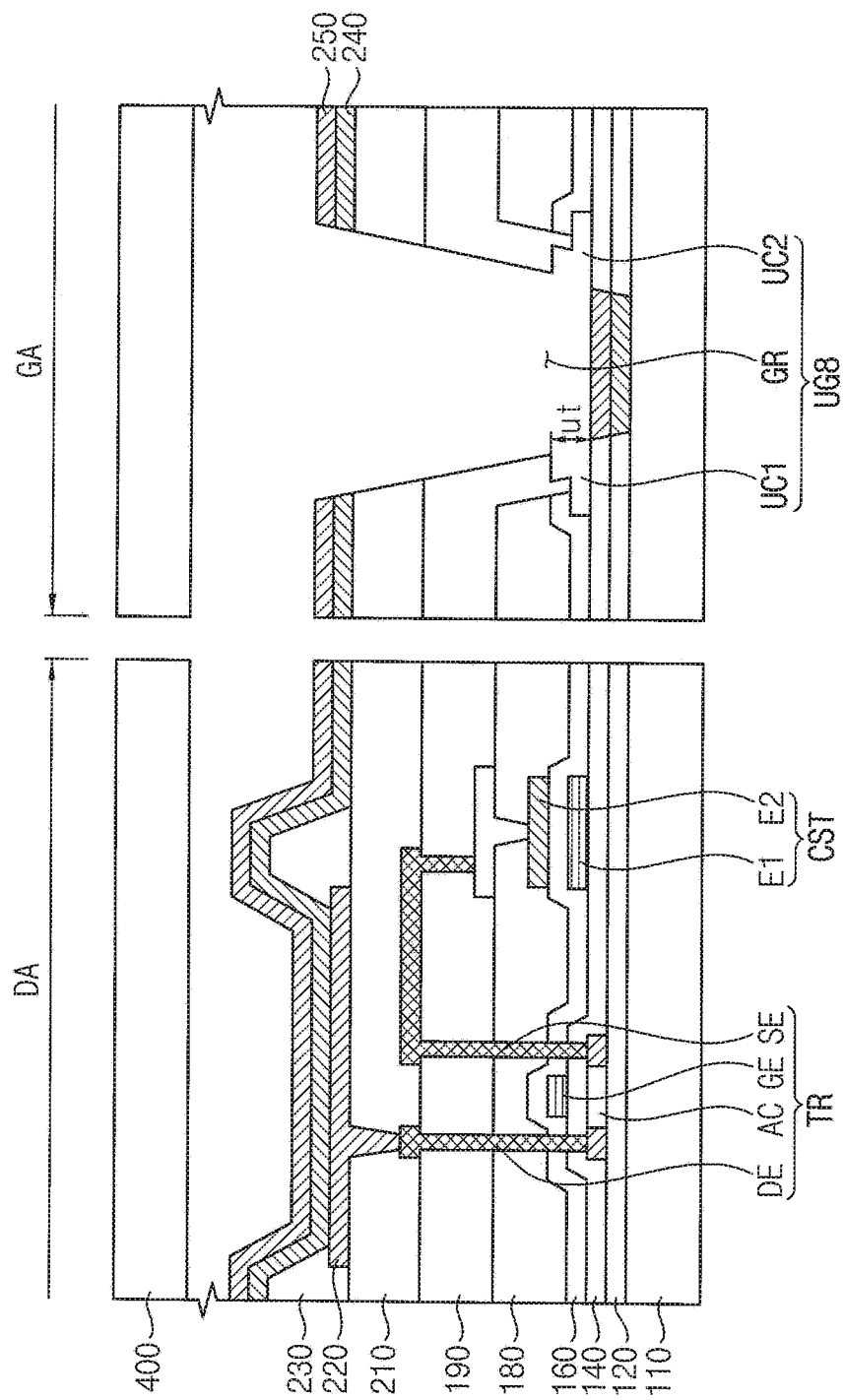
FIG. 29 is a cross-sectional diagram for describing a display device according to example embodiments.

FIG. 29 is a cross-sectional diagram for describing a display device according to example embodiments.

Referring to FIG. 29, the display device according to one embodiment may include the transistor TR, the storage capacitor CST, the pixel electrode 220, the organic light emitting layer 240, and the common electrode layer 250 disposed in the display area DA, and may include an undercut-groove UG8 disposed in the groove area GA which is the non-display area NDA.

The undercut-groove UG8 includes a groove GR formed by removing the buffer layer 120, the first insulating layer 140, the second insulating layer 160, the third insulating layer 180, a fourth insulating layer 190, and a fifth insulating layer 210. In addition, the undercut-groove UG8 includes a first undercut UC1 formed between the first insulating layer 140 and the fourth insulating layer 190 in the first sidewall of the groove GR, and a second undercut UC2 formed between the first insulating layer 140 and the fourth insulating layer 190 in the second sidewall of the groove GR. The fourth insulating layer 190 may be an inorganic insulating layer including silicon nitride, silicon oxide, silicon oxynitride, or the like, or an organic insulating layer including an acrylic resin, an epoxy-based resin, a polyimide-based resin, a polyester-based resin, or the like. The second insulating layer 160 may include a first lower undercut and a second lower undercut. The fourth insulating layer 190 may include a first upper undercut and a second upper undercut. The first undercut UC1 may include the first lower undercut and the first upper undercut. The second undercut UC2 may include the second lower undercut and the second upper undercut.

According to this embodiment, a thickness ut of each of the first and second undercuts UC1 and UC2 of the undercut-groove UG8 may be thicker than the thickness of each of the undercuts included in the undercut-grooves of the previous embodiments.

Figure 30:
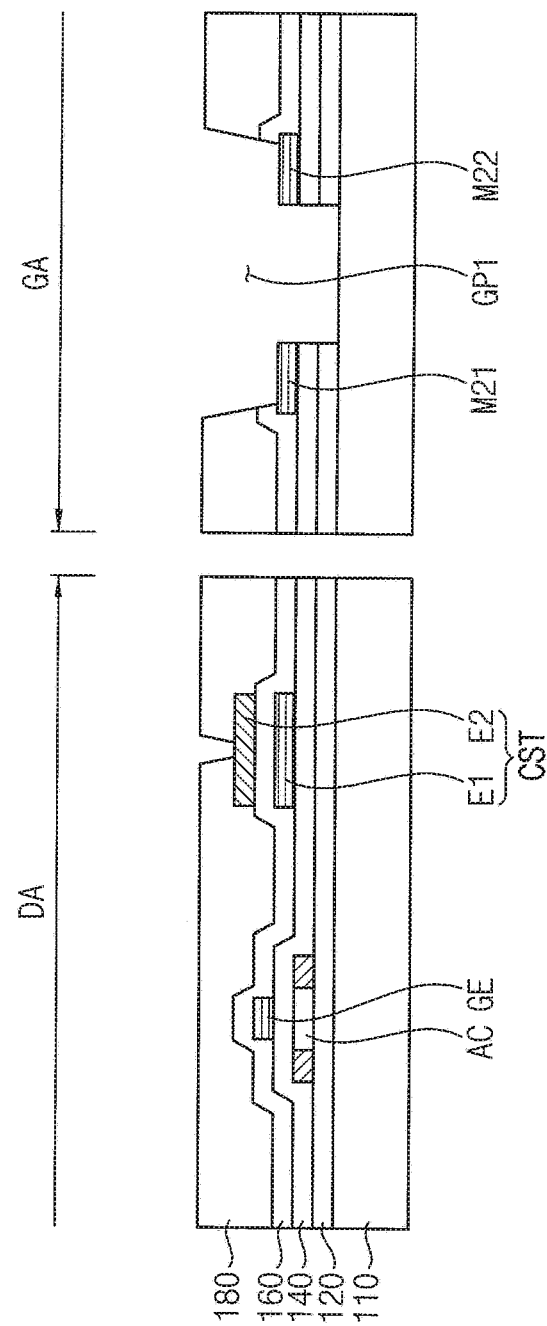
FIG. 30, FIG. 31, and FIG. 32 are cross-sectional diagrams illustrating structures formed in a method of manufacturing the display device of FIG. 29 according to example embodiments.
Figure 31:
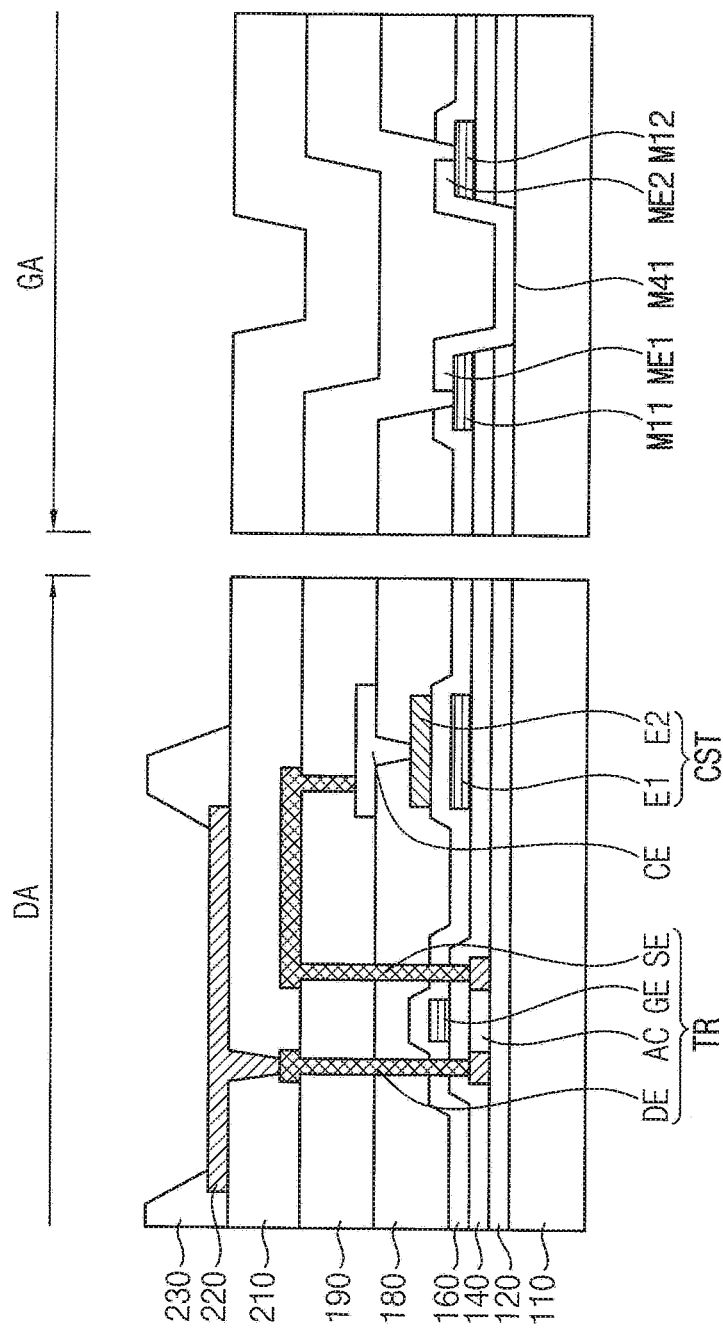
Figure 32:
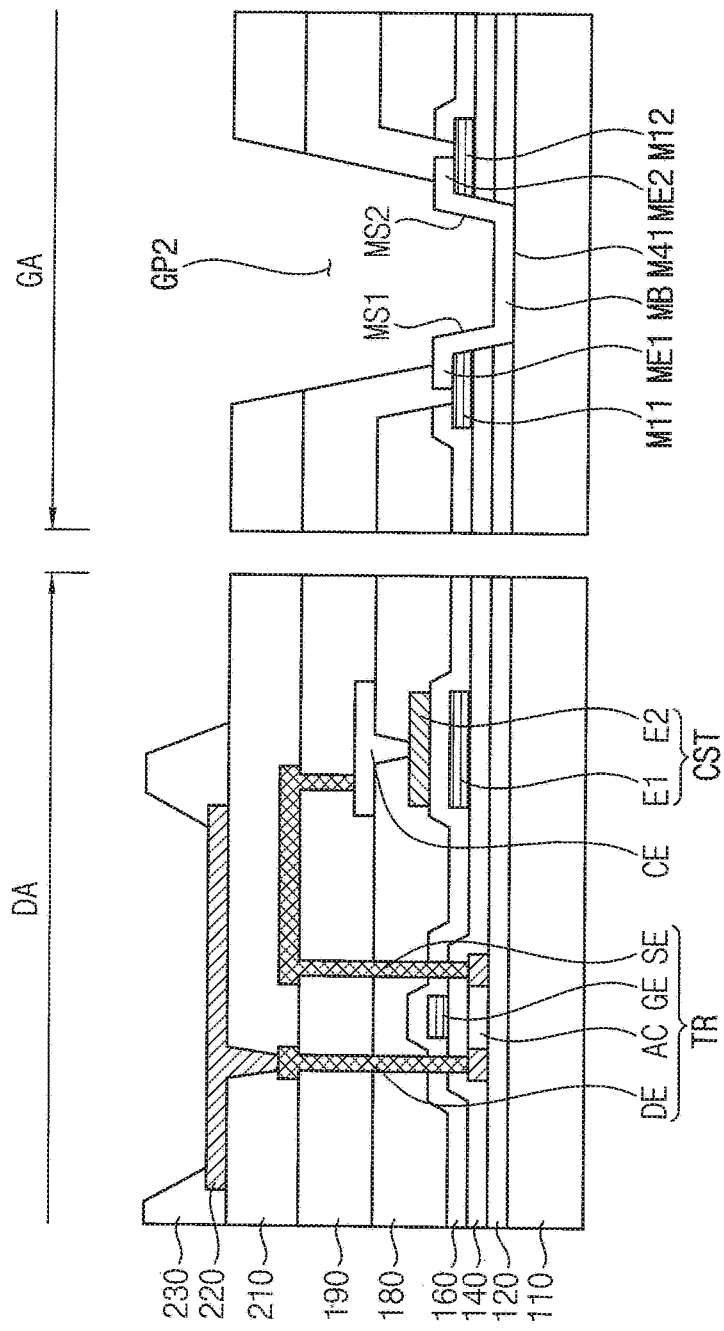

FIGS. 30 to 32 are cross-sectional diagrams for describing a method of manufacturing the display device of FIG. 29.

Referring to FIG. 30, the buffer layer 120 may be formed on the base substrate 110. The semiconductor layer AC is formed on the buffer layer 120.

The first insulating layer 140 is formed on the base substrate 110 on which the semiconductor layer AC is formed.

The first conductive layer is formed on the first insulating layer 140, and first conductive patterns GE, E1, M11, and M12 are formed by patterning the first conductive layer. The first conductive patterns GE, E1, M11, and M12 may include the gate electrode GE and the first capacitor electrode E1 of the storage capacitor CST formed in the display area DA, and may include the first undercut electrode M11 and the second undercut electrode M12 spaced apart from the first undercut electrode M11 formed in the groove area GA which is the non-display area NDA.

The second insulating layer 160 is formed on the base substrate 110 on which the first conductive patterns GE, E1, M11, and M12 are formed. The second conductive layer is formed on the second insulating layer 160, and a second conductive pattern is formed by patterning the second conductive layer. The second conductive pattern E2 may include the second capacitor electrode E2 of the storage capacitor CST formed in the display area DA.

The third insulating layer 180 is formed on the base substrate 110 on which the second conductive pattern E2 is formed. Contact holes are formed in the display area DA by simultaneously etching the buffer layer 120 and the first, second, and third insulating layers 140, 160, and 180, and a first groove pattern GP1 is formed in the groove area GA which is the non-display area NDA.

The contact hole in the display area DA may be formed by removing the third insulating layer 180 to expose the second capacitor electrode E2. The first groove pattern GP1 in the groove area GA may be formed by removing the buffer layer 120, the first insulating layer 140, the second insulating layer 160, and the third insulating layer 180 about the first undercut electrode M11 and the second undercut electrode M12 to expose the base substrate 110, a top surface and a section of the first undercut electrode M11, and a top surface and a section of the second undercut electrode M12.

Referring to FIG. 31, the third conductive layer is formed on the base substrate 110 on which the contact holes and the first groove pattern GP1 are formed, and third conductive patterns CE and M41 are formed by patterning the third conductive layer.

The third conductive patterns CE and M41 may include a connection electrode CE formed in the display area DA and a third undercut electrode M41 in the groove area GA.

The connection electrode CE may be connected to the second capacitor electrode E2 through the contact hole. The third undercut electrode M41 is disposed in a separation region between the first undercut electrode M11 and the second undercut electrode M12. A first end ME1 of the third undercut electrode M41 may overlap the first undercut electrode M11 while making direct contact with the first undercut electrode M11 from a top of the first undercut electrode M11, and a second end ME2 of the third undercut electrode M41 may overlap the second undercut electrode M12 while making direct contact with the second undercut electrode M12 from a top of the second undercut electrode M12.

The third undercut electrode M41 may make contact with the top surface and the section of the first undercut electrode M11, the base substrate 110, and the top surface and the section of the second undercut electrode M12 which are exposed through the first groove pattern GP1.

The fourth insulating layer 190 is formed on the base substrate 110 on which the third conductive patterns CE and M41 are formed. A plurality of contact holes are formed by simultaneously etching the first, second, third, and fourth insulating layers 140, 160, 180, and 190 in the display area DA. The contact holes in the display area DA may be formed by removing the first, second, third, and fourth insulating layers 140, 160, 180, and 190 to expose the semiconductor layer AC and the connection electrode CE.

A fourth conductive layer is formed on the base substrate 110 on which the contact holes are formed, and fourth conductive patterns SE and DE are formed by patterning the fourth conductive layer.

The fourth conductive patterns SE and DE may include the source electrode SE and the drain electrode DE of the transistor TR formed in the display area DA.

The source electrode SE may be connected to the source region of the semiconductor layer AC through the contact hole, and the drain electrode DE may be connected to the drain region of the semiconductor layer AC through the contact hole. In addition, the transistor TR may be connected to the second capacitor electrode E2 and the connection electrode CE of the storage capacitor CST through the contact hole.

The fifth insulating layer 210 is formed on the base substrate 110 on which the fourth conductive patterns SE and DE are formed. The contact hole configured to expose the drain electrode DE of the transistor TR is formed by patterning the fifth insulating layer 210.

The pixel electrode 220 is formed by depositing a conductive material such as metal or transparent conductive oxide on the fifth insulating layer 210 having the contact hole, and patterning the deposited conductive material.

A sixth insulating layer 230 is formed on the base substrate 110 on which the pixel electrode 220 is formed, and the opening configured to expose the pixel electrode 220 is formed by patterning the sixth insulating layer 230. The opening may define the light emitting area of the pixel P.

Referring to FIGS. 29 and 32, a second groove pattern GP2 configured to expose a bottom MB, a first side MS1, and a second side MS2 of the third undercut electrode M41 is formed by patterning the fourth insulating layer 190 and the fifth insulating layer 210 formed in the groove area GA of the non-display area NDA.

Through the dry etching process, the entire third undercut electrode M41 may be removed through the bottom MB, the first side MS1, and the second side MS2 of the third undercut electrode M41 exposed by the second groove pattern GP2 in the groove area GA.

Accordingly, in the groove area GA, a groove GR corresponding to the second groove pattern GP2 may be formed, the first undercut UC1 having a thickness ut corresponding to thicknesses of the first undercut electrode M11 and the first end ME1 of the third undercut electrode M41 may be formed in the first sidewall of the groove GR by the first undercut electrode M11 and the first end ME1 of the third undercut electrode M41 overlapping the first undercut electrode M11, and the second undercut UC2 having a thickness ut corresponding to thicknesses of the second undercut electrode M12 and the second end ME2 of the third undercut electrode M41 may be formed in the second sidewall of the groove GR by the second undercut electrode M12 and the second end ME2 of the third undercut electrode M41 overlapping the second undercut electrode M12.

The undercut-groove UG8 may be formed in the groove area GA.

The undercut-groove UG8 may include the groove GR having a depth corresponding to thicknesses of the buffer layer 120, the first insulating layer 140, the second insulating layer 160, the third insulating layer 180, and the fourth insulating layer 190, the first undercut UC1 formed between the first insulating layer 140 and the fourth insulating layer 190 in the first sidewall of the groove GR, and the second undercut UC2 formed between the first insulating layer 140 and the fourth insulating layer 190 in the second sidewall of the groove GR.

After the undercut-groove UG8 is formed, the organic light emitting layer 240 and the common electrode layer 250 may be sequentially formed over the entire area of the base substrate 110.

The organic light emitting layer 240 and the common electrode layer 250 may be formed along the sidewall of the groove GR in the groove area GA, may be effectively broken by the undercuts UC1 and UC2, and may be formed on the bottom surface of the groove GR. Therefore, potential contaminants such as moisture and oxygen of the external air can be prevented from being introduced into the display area DA along the organic light emitting layer 240 that is formed of an organic material.

According to embodiments, undercuts of an insulating layer may effectively separate organic material portions (e.g., portions of an organic light emitting material layer); an undercut-groove with the undercuts may effectively prevent moisture and potential contaminants (e.g., contained in external air) from being transmitted into the display area through an organic material layer.

In an undercut-groove pattern, a groove may be formed by etching an undercut electrode and an insulating layer overlapping the undercut electrode, and an undercut may be formed in a sidewall of the groove by etching the undercut electrode exposed by the groove. Accordingly, a depth of the groove can optimized by setting a thickness of the insulating layer, and a dimension of the undercut can be optimized by setting a thickness of the undercut electrode.

One or more embodiments may be applied to a display device. For example, one or more embodiments may be applied to a display device included in a computer, a laptop, a cellular phone, a smart phone, a smart pad, a portable multimedia player (PMP), a personal digital assistant (PDA), an MP3 player, etc.

The foregoing is illustrative of example embodiments and is not limiting. Although a few example embodiments have been described, many modifications are possible. All such modifications are within the scope defined in the claims.

What is claimed is:
1. A display device comprising:
a substrate;

an organic light emitting layer overlapping the substrate and comprising an opening; and an insulating layer positioned between the substrate and the organic light emitting layer, wherein a first through hole is formed through the substrate, the organic light emitting layer, and the insulating layer, wherein the insulating layer comprises a first groove and a first undercut, wherein a position of the opening overlaps a position of the first groove, wherein the first groove surrounds the first through hole in a plan view of the display device, and wherein the first undercut surrounds the first groove in the plan view of the display device.

2. The display device of claim 1, further comprising:
a buffer layer formed on the substrate;
an intervening insulating layer positioned between the buffer layer and the insulating layer; and
a gate electrode positioned between the intervening insulating layer and the insulating layer.

3. The display device of claim 1, wherein the insulating layer further comprises a second undercut, wherein the second undercut surrounds the first through hole in the plan view of the display device, and wherein the first groove surrounds the second undercut in the plan view of the display device.

4. The display device of claim 1, further comprising:
a transistor comprising a gate electrode; and
an intervening insulating layer positioned between the substrate and the insulating layer, wherein the gate electrode is positioned between the intervening insulating layer and the insulating layer, and wherein a wall of the first undercut directly contacts the intervening insulating layer.

5. The display device of claim 1, further comprising:
a transistor comprising a source electrode; and
an intervening insulating layer positioned between the substrate and the insulating layer, wherein the source electrode is positioned between the insulating layer and the organic light emitting layer, and wherein a wall of the first undercut directly contacts the intervening insulating layer.

6. The display device of claim 1, further comprising:
an overlapping insulating layer overlapping the insulating layer, positioned between the insulating layer and the organic light emitting layer, and comprising a second groove, wherein the second groove is directly connected to the first groove.

7. The display device of claim 6, further comprising:
a transistor comprising a source electrode, wherein the source electrode is positioned between the overlapping insulating layer and the organic light emitting layer.

8. The display device of claim 1, further comprising: an overlapping insulating layer overlapping the insulating layer and positioned between the insulating layer and the organic light emitting layer,
wherein the insulating layer further comprises a second undercut,
wherein the second undercut surrounds the first through hole in the plan view of the display device,
wherein the first groove surrounds the second undercut in the plan view of the display device,
wherein the overlapping insulating layer comprises a second groove, a third undercut, and a fourth under cut,
wherein a position of the second groove overlaps a position of the first groove,
wherein the fourth undercut is closer to the first through hole than the second groove, and
wherein the second groove is closer to the first through hole than the third undercut.

9. The display device of claim 8, further comprising:
a transistor comprising a source electrode, wherein the source electrode is positioned between the overlapping insulating layer and the organic light emitting layer.

10. The display device of claim 1, further comprising:
a transistor comprising a source electrode; and
a storage capacitor comprising a first capacitor electrode,
wherein the insulating layer is positioned between the organic light emitting layer and at least one of the source electrode and the first capacitor electrode.

11. The display device of claim 1, further comprising:
an overlapping insulating layer positioned between the insulating layer and the organic light emitting layer, overlapping the insulating layer, partially positioned inside the first groove, and comprising an additional undercut, wherein the additional undercut is at least partially positioned inside the first groove.

* * * * *